(12) United States Patent
Rosmeulen et al.

(10) Patent No.: US 11,776,564 B2
(45) Date of Patent: Oct. 3, 2023

(54) MEMORY DEVICE

(71) Applicant: IMEC vzw, Leuven (BE)

(72) Inventors: Maarten Rosmeulen, Ghent (BE); Arnaud Furnemont, Jandrenouille (BE); Devin Verreck, Pellenberg (BE); Antonio Arreghini, Kessel-Lo (BE); Willem Van Roy, Bierbeek (BE); Kherim Willems, Sint-Joris-Weert (BE)

(73) Assignee: IMEC vzw, Leuven (BE)

( * ) Notice: Subject to any disclaimer, the term of this patent is extended or adjusted under 35 U.S.C. 154(b) by 135 days.

(21) Appl. No.: 17/645,663

(22) Filed: Dec. 22, 2021

(65) Prior Publication Data

US 2022/0199112 A1 Jun. 23, 2022

(30) Foreign Application Priority Data

Dec. 23, 2020 (EP) .................................. 20217146

(51) Int. Cl.
*G11B 3/00* (2006.01)
(52) U.S. Cl.
CPC .................................. *G11B 3/008* (2013.01)
(58) Field of Classification Search
CPC .... G11B 3/008; B01L 3/502761; G11C 25/00
See application file for complete search history.

(56) References Cited

U.S. PATENT DOCUMENTS

| | | | |
|---|---|---|---|
| 2006/0062698 A1* | 3/2006 | Foster | A61M 1/3678 422/504 |
| 2008/0160622 A1* | 7/2008 | Su | G01N 1/4044 436/86 |
| 2008/0185057 A1 | 8/2008 | Prakash et al. | |
| 2009/0148856 A1* | 6/2009 | Miller | G01N 33/9493 435/7.1 |

(Continued)

FOREIGN PATENT DOCUMENTS

| EP | 1202802 A1 | 5/2001 |
|---|---|---|
| WO | WO 01/12327 A1 | 2/2001 |

OTHER PUBLICATIONS

Adamatzky, "The dry history of liquid computers," arxiv.org, XP081040938, Cornell University Library, Nov. 25, 2018, pp. 1-23.

(Continued)

*Primary Examiner* — Andrew Sasinowski
(74) *Attorney, Agent, or Firm* — Knobbe, Martens, Olson & Bear, LLP

(57) ABSTRACT

A memory device including at least one channel and a fluid including particles is provided. In one aspect, the channel includes a least some of the fluid. The memory device may further include an actuator configured to induce a movement of the particles in the channel; and a writing element configured to arrange the particles in a sequence, thereby yielding a sequence of particles in the channel. The particles may include first particles and second particles. The particles may be in a first state or a second state in the channel. In certain aspects, the channel is configured to preserve the sequence of the particles. The memory device may further include a reading element for detecting the sequence of the particles in the channel.

15 Claims, 11 Drawing Sheets

(56) References Cited

U.S. PATENT DOCUMENTS

| 2012/0264646 | A1* | 10/2012 | Link | C40B 40/04 |
| | | | | 435/23 |
| 2014/0097129 | A1* | 4/2014 | Foster | G01N 15/1459 |
| | | | | 209/579 |
| 2019/0137931 | A1* | 5/2019 | Mueth | G01N 15/14 |

OTHER PUBLICATIONS

Extended European Search Report dated Jun. 2, 2021 in European Application No. 20217146.8, 8 pages.
Harrer et al., "Label-free screening of single biomolecules through resistive pulse sensing technology for precision medicine applications," Nanotechnology 26 (2015), pp. 1-19.
Kim et al., "Dielectrophoresis: From Molecular to Micrometer-Scale Analytes," Analytical Chemistry, 91 (2019), pp. 277-295.
Liu et al., "Developmental Progress of the Nanoparticle Field Extraction Thruster," American Institute of Aeronautics and Astronautics, 44th AIAA/ASME/SAE/ASEE Joint Propulsion Conference & Exhibit, Jul. 21-23, 2008, Hartford, CT, pp. 1-16.
Mitscha-Baude et al., "Adaptive and iterative methods for simulations of nanopores with the PNP-Stokes equations," Journal of Computational Physics, 338 (2017), pp. 452-476.
Myers et al., Nature Nanotechnology 10 (2015) pp. 886-891.
Phillips et al., "Digital Colloids: Reconfigurable Clusters as High Information Density Elements," Soft Matter, vol. 10, No. 38 (Oct. 2014) pp. 7468-7479.
Vlassiouk et al., "Ionic Selectivity of Single Nanochannels," Nano Letters, American Chemical Society, vol. 8, No. 7, (2008) pp. 1978-1985.

* cited by examiner

MEMORY DEVICE

CROSS-REFERENCE TO RELATED APPLICATIONS

This application claims foreign priority to European Application No. 20217146.8, filed Dec. 23, 2020, which is incorporated by reference herein in its entirety.

BACKGROUND

Technological Field

The disclosed technology relates to a memory device and to a method for making the memory device.

Description of the Related Technology

Over the past decades, hard disk drives have been applied as main data storage medium in, for example, mobile phones, personal computers and data centers. More recently, NAND type flash memory devices, that is NAND devices, have progressively been replacing hard disk drives in such applications. This replacement has been enabled by the small dimensions and high data rates of the NAND devices. At present, to further improve bit density, vertical stacking of memory cells is applied, wherein the memory cells are stacked in cylindrical memory holes, yielding vertical NAND devices, that is three dimensional (3D) NAND devices. The vertical stacking allows for an increase in bit density without requiring a reduction in volume of individual memory cells. It is expected that the bit density of 3D NAND devices will continue to increase while the cost per bit of 3D NAND devices will continue to be reduced in the near future, due to further stacking of memory cells, thereby increasing the number of cells per memory hole. The increase in the stack height is limited, however, by a tapering angle of the cylindrical memory hole, which is inherent to the etching techniques used to form the cylindrical memory hole. As the cylindrical memory hole becomes very long due to the further stacking of memory cells, even the slightest tapering angle results in large variability in spatial dimensions of the memory cells in the cylindrical memory hole. A possibility to further increase bit density is to reduce vertical spacing between adjacent memory cells, but this possibility is also limited, as it may result in increased interference between the adjacent memory cells. Hence, routes to further increase bit density in NAND devices are limited.

Therefore, to overcome this limitation, new concepts for memory devices may be required. Non-volatile memory devices attain high densities by packing identical memory cells in dense two- or three-dimensional arrays. The memory cells are connected to a dense net of conductor lines that run in different directions across the memory array. In general, each memory cell consists of two elements. The first element stores one or more bits of information by altering the physical state of a material contained therein, for example, change electrostatic charge, magnetic or ferroelectric polarization or switching between amorphous and crystalline phases. The second element connects the first storage element to the conductor net and ensures that each memory cell can be addressed individually for reading, writing, and erasing of information, without disturbing the memory content of the other memory cells connected to the same conductor grid. Typically, transistors or diodes are used for the addressing elements and only 1 bit is stored in each memory cell. Increasing the bit density requires reducing the dimension of both the storage and addressing elements. The biggest challenge for scaling high-density memories is reducing the size of the addressing element and increasing the number of bits stored in each cell. NAND devices have attained the highest densities of all-solid-state memories because of their very compact addressing element at the limits of manufacturing resolution and storage of up to 4 bits per cell. Whereas storage elements can be envisaged that are smaller than what is achievable with electrostatic storage used in NAND devices, there is currently no known alternative addressing element that can be made more compact than NAND devices in a cost-effective way. Also, there is no known alternative solid-state memory that is able to store more than 4 bits in each memory cell. Therefore, new concepts with better scaling potential as compared to NAND flash, must undo with the conventional architecture of each memory cell consisting of addressing and storage elements. A new concept may decouple reading and writing elements from the data storage carrier.

Previously, a memory device making use of a nanoparticle for data storage was described in Myers et al., Nature Nanotechnology 10 (2015) pages 886-891. In this paper, the memory device stores information by moving a single colloidal nanoparticle having spatial dimensions of 160 nm by 50 nm and which is dispersed in water, between a pair of fluidic slits that are fluidically connected to each other via a gap. A movement of the nanoparticle from a first slit to a second slit is induced by electro-osmosis. The two fluidic slits are oriented perpendicular with respect to each other, so that movement of the nanoparticle is accompanied by a 90° rotation of the nanoparticle. Because the nanoparticle in the first slit is oriented perpendicular with respect to the nanoparticle in the second slit, optical readout is possible to determine in which of the two slits the nanoparticle is stored by making use of polarized light. That is, in this memory device, writing and reading are advantageously decoupled. Nevertheless, bit density of this memory device is projected in the paper by Myers et al. to be several orders of magnitude lower than that of NAND devices, with limited room for margin.

Therefore, there is a need in the art for a novel type of memory device having a large bit density, such as larger than that of memory devices of the state of the art, for example, hard disk drives and NAND devices. Furthermore, a rate of reading and/or writing of bits in the novel type of memory device can be at least comparable or even larger than that of devices of the state of the art. Finally, the novel type of memory device can be cost-efficient.

SUMMARY OF CERTAIN INVENTIVE ASPECTS

It is an object of the disclosed technology to provide a memory device and a method for making the memory device.

The above and other objectives are accomplished by a method and device according to the disclosed technology.

Advantageously, data may be stored in the memory device of the disclosed technology as a sequence of particles in a channel. In embodiments, the channel may be long, so that the sequence of the particles may include a plurality of particles. Advantageously, a single particle, for example, a nanoparticle or a molecule may function as a single bit of data for data storage: therefore, the memory device may be comparatively cheap compared to contemporary devices for data storage, wherein a single bit of data storage generally requires considerably more advanced structures, for example, a MOSFET. Advantageously, manufacturing of the memory device according to embodiments of the disclosed technology may be relatively simple and cheap.

In embodiments, the length of the channel may be limited only by a time required to access stored data. The width and, for example, tapering angle of walls of the channel or differences between channels are typically not very critical. In some embodiments, the width may be limited only by a width of the particle. Furthermore, the memory device may include a plurality of channels, wherein adjacent channels may be spaced close together. Therefore, advantageously, with the memory device according to embodiments of the disclosed technology, a very large bit density may be reached, such as a bit density of above 5 Tb/mm2. Advantageously, in embodiments, the memory device of the disclosed technology may require little power, for example, <5 W/(Gb·s). In embodiments, a speed of writing may be below 100 µs per particle (that is, bit) per channel. In embodiments, information stored in the memory device may be stored for an extended time.

In a first aspect, the disclosed technology relates to a memory device including: a) at least one channel, b) a fluid including particles, wherein the channel includes a least some of the fluid, c) an actuator for inducing a movement of the particles in the channel, d) a writing element for arranging in a sequence the particles, thereby yielding a sequence of particles in the channel, wherein either: i) the particles include first particles and second particles, and wherein arranging of the particles includes arranging the first and second particles in a particular order, or ii) the particles can be in a first state or a second state in the channel, and wherein arranging of the particles includes arranging the particles in a first and second state in a particular order, and wherein the channel is adapted to preserve the sequence of the particles, and e) a reading element for detecting the sequence of the particles in the channel.

In a second aspect, the disclosed technology relates to a method for making a memory device, including: a) obtaining at least one channel, b) filling the channel with a fluid including particles, wherein either: i) the particles include first particles and second particles, or ii) the particles can be in a first state or a second state in the channel, c) providing the device with an actuator suitable for inducing a movement of the particles in the channel, d) providing the device with a writing element suitable for arranging in a sequence the particles, thereby yielding a sequence of particles in the channel, and e) providing the device with a reading element for detecting the sequence of the particles in the channel, wherein the channel is adapted to preserve the sequence of the particles.

Particular aspects of the disclosed technology are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, embodiments of the disclosed technology are believed to represent substantial new and novel improvements, including departures from prior practices, resulting in the provision of more efficient, stable and reliable devices of this nature.

The above and other characteristics, features and advantages of the disclosed technology will become apparent from the following detailed description, taken in conjunction with the accompanying drawings, which illustrate, by way of example, the principles of the disclosed technology. This description is given for the sake of example only, without limiting the scope of the disclosed technology. The reference figures quoted below refer to the attached drawings.

Figure 1:
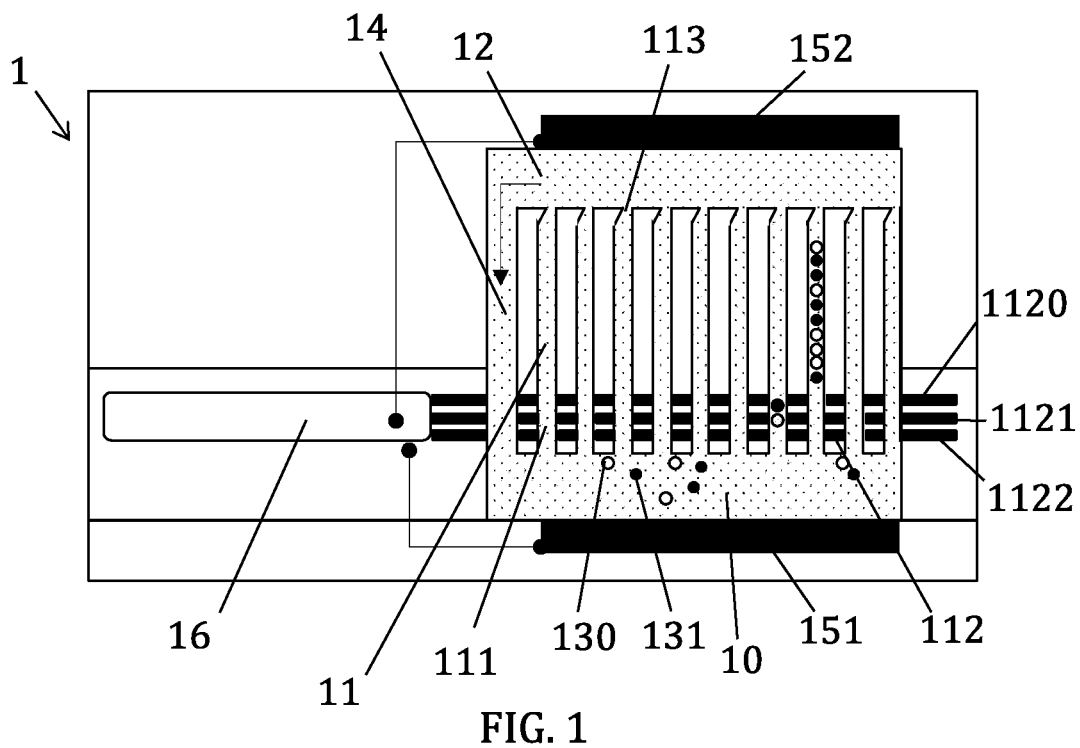
FIG. 1 is a vertical cross-section of a memory device including first particles and second particles according to embodiments of the disclosed technology.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings, but the disclosed technology is not limited thereto. The drawings described are only schematic and are non-limiting. In the drawings, the size of some of the elements may be exaggerated and not drawn to scale for illustrative purposes. The dimensions and the relative dimensions do not correspond to actual reductions to practice of the disclosed technology.

Furthermore, the terms first, second, third, and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosed technology therefore also includes as one embodiment that no further components are present. Thus, the scope of the expression "a device comprising means A and B" should not be interpreted as being limited to devices consisting only of components A and B. It means that with respect to the disclosed technology, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various aspects of the disclosed technology. This method of disclosure, however, is not to be interpreted as reflecting an intention that the claimed disclosed technology requires more features than are expressly recited in each claim. Rather, as the following claims reflect, aspects of the disclosed technology lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosed technology.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

In a first aspect, the disclosed technology relates to a memory device including: a) at least one channel, b) a fluid including particles, wherein the channel includes a least some of the fluid, c) an actuator for inducing a movement of the particles in the channel, d) a writing element for arranging in a sequence the particles, thereby yielding a sequence of particles in the channel, wherein either: i) the particles include first particles and second particles, and wherein arranging of the particles includes arranging the first and second particles in a particular order, or ii) the particles can be in a first state or a second state in the channel, and wherein arranging of the particles includes arranging the particles in a first and second state in a particular order, and wherein the channel is adapted to preserve the sequence of the particles, and e) a reading element for detecting the sequence of the particles in the channel.

In embodiments, the particles may include any type of particles, such as nanoparticles, nano-objects, or molecules. The particles may, for instance, include Janus particles, homogeneous particles, particles including a core and a shell wherein a material of the core is different from a material of the shell, that is core-shell particles, elongated dipolar molecules, or self-propelled particles. The particles may be spherical, but the disclosed technology is not limited thereto, and the particles may alternatively have an irregular shape. In embodiments, the particles include at least two types of particles, that is, first particles and second particles, but may include further types of particles such as third particles, and so on. In embodiments, the different types of particles differ with respect to at least one of the following features: material composition; dielectric coefficient; shape; or size. In embodiments, the particles include or consist of a metal, a semiconductor, a dielectric material or an isolator. In alternative embodiments, the particles include or consist of large molecules, for example, bio-molecules, such as proteins or virus particles, or they could be combinations of inorganic particles coated with molecules, for example, bio-molecules.

In embodiments, the particles can be in at least two states in the channel, that is, in a first state or in a second state, but more states may also be possible. In these embodiments, the particles may have a first end and a second end, wherein the first end has different properties than the second end: for instance, the first end may have a different charge, a different dielectricity, a different size, a different shape, a different density, a different magnetic property, a different spin state, a different bandgap, a different stiffness, a different roughness, a different porosity and/or a different wettability than the second end. The two states and the reading element are typically such that the reading element can detect the state in which each particle in the channel is. The different properties of the first and second ends and the reading element are typically such that the reading element can differentiate between both properties and, hence, between both ends. In certain aspects, the particles that can be in at least two states are elongated particles. In certain embodiments, the particles that can be in at least two states may include dipolar particles, such as elongated dipolar particles, including a first pole and a second pole. In embodiments, the dipolar particles may include magnetic particles having a north pole and a south pole. In embodiments, the dipolar particles include molecules with a large molecule dipole moment. In embodiments, the charge of the first pole may have a different magnitude or a different sign than the charge of the second pole. In embodiments, in the first state, the first end (for example, pole) of the particle is oriented in a first direction in the channel and the second end (for example, pole) of the particle is oriented in a second direction, different from (for example, opposite to) the first direction, in the channel. In these embodiments, in the second state, the first pole of the dipolar particle is oriented in the second direction and the second pole of the dipolar particle is oriented in the first direction. In embodiments, the first direction and the second direction can be directed along a longitudinal axis of the channel.

In specific embodiments, the particles include the at least two types of particles, and, in addition, at least one of the two types of particles may include the at least two states in the channel.

In embodiments, the fluid may include the particles and a liquid, wherein the liquid may be any liquid suitable for dispersing the particles. For instance, the liquid may include water, ionic liquids, molten salts, organic solvents such as alcohols, oils, or liquids including hydro-carbon. In embodiments, the liquid may include polar solvents, polar protic solvents, polar aprotic solvents or nonpolar solvents. In embodiments, the liquid may include metal ions or agents, for example, for dispersing the particles or to prevent the particles from not stick to walls or to each other.

In embodiments, the channel may be a nanochannel, that is, a width of the channel may be smaller than 100 nm. In embodiments, the channel is an open cavity defined by walls of the channel. In embodiments, a width of the channel is defined by a distance between opposing walls of the channel. In embodiments, the shape of the channel is not limited to any shape. In certain embodiments, the channel is elongated, wherein a length of the channel parallel to a longitudinal axis of the channel is larger than the width of the channel. In embodiments, the shape of the channel may include: a cylindrical shape, such as a circular cylindrical shape; a rectangular cuboid, such as a square cuboid; a hexagonal prism; or an irregular shape. In certain embodiments, the particles are able to move through an inner volume of the channel, for example, along the longitudinal axis of the channel, such as along the complete length of the channel, without being blocked as a result of the diameter of the channel being, for example, locally, too narrow for the particles to pass. In certain embodiments, the width of the channel can be constant throughout the channel, but the channel is advantageously not limited thereto. In embodiments, a material in which the channels are included may include any material used in semiconductor processing. In embodiments, the material may be conducting or non-conducting. In embodiments, the material may include or consist of high-κ dielectrics or low-κ dielectrics such as $SiO_2$, $Si_3N_4$, $Al_2O_3$, $HfO_2$, $ZrO_2$, or a silicon oxynitride. In embodiments, the material includes or consists of metal such as Al, Ti, Ta, TiN, TaN, Pt, Cu, Sn, Mo, Ru, or Co. In embodiments, the material includes or consists of a semiconductor such as crystalline silicon, amorphous silicon, Ge SiGe, or a III-V compound semiconductor such as GaAs, InGaAs, InP, or GaN. In embodiments, the material includes polymers, for example, the material may be a plastic. In embodiments, walls of the channel may be coated with organic molecules, for instance for avoiding that the particles stick to the walls.

In certain embodiments, the memory device includes at least one channel, such as a plurality of channels. In embodiments, by increasing a number of channels in the memory device, advantageously a bit density of the memory device may be increased. In embodiments, the plurality of channels have the same dimensions. Advantageously, the uniform dimensions may result in a uniformity of operations, that is, a uniform time for the detecting of the sequence of particles, a uniform time for the arranging of the particles in the sequence, and a uniform lifetime of the sequence of the particles in the channel. In embodiments, the plurality of channels may be ordered in, for example, equally spaced rows and/or, for example, equally spaced columns. In embodiments, the longitudinal axis of each of the plurality of channels is aligned along a same axis. Advantageously, in these embodiments, at least part of the actuator may be shared between the plurality of channels.

In embodiments, the shape of the channel is only limited in that the channel is adapted to preserve the sequence of the particles in the channel. For instance, the width of the channel may be such that the particles cannot pass each other in the channel, for example, along a longitudinal axis of the channel. In embodiments, the width of the channel is larger than a width of the particles, for example, larger than a width of the largest particle among different types of particles. In embodiments, the width of the channel may be smaller than twice a width of the particles, such as smaller than twice a width of the smallest particles. In these embodiments, the sequence of the particles may be preserved as the particles cannot pass each other along the longitudinal axis of the channel. In embodiments wherein the particles include particles, such as elongated particles, including the first state and the second state in the channel, the diameter of the channel may be limited such that the particles cannot rotate, thereby switching between the states of the particle.

In embodiments, a wall of the channel, such as a surface of the wall, is charged. In embodiments, the zeta potential of the wall is nonzero. In embodiments, the zeta potential of the particles is nonzero, wherein the zeta potential of the wall can have a same sign as the zeta potential of the particles. Advantageously, in these embodiments, the particles and the wall may repel each other. In these embodiments, the particles may move away from the wall, for example, to a central axis of the channel. In embodiments, thereby, the width of the channel may be larger than twice the width of the particles, wherein nevertheless the particles will not pass each other along the longitudinal axis of the channel. In embodiments, thereby, the sequence of particles may be preserved in the channel by the wall being adapted to repel the particles. Advantageously, in these embodiments, spatial dimensions of the channel are not very critical, as the particles may be repelled to the central axis of the channel by the wall.

In embodiments, the sequence of particles in the channel may correspond to stored information, that is, memory data. For instance, in the context of a binary numeral system including "ones" and "zeros" generally used in contemporary computers for encoding data, the first particles or the particles in the first state in the channel may correspond to "ones", and the second particles or the particles in the second state in the channel may correspond to "zeros". In embodiments, the sequence of particles in the channel may thereby correspond to a sequence of zeros and ones. Advantageously, the disclosed technology is not limited thereto: for instance, by using more than two types of particles or by using particles with more than two states, the sequence of particles may correspond to stored information encoded, for example, in a ternary or quaternary numeral system. As such, the writing element may, by arranging in the sequence the particles in the channel, store information in the channel. Accordingly, the reading element may, by detecting the sequence of the particles in the channel, read the information stored in the channel.

In embodiments, a length of the channel may be from 0.1 to 1000 µm, such as from 1 to 200 µm, such as from 1 to 100 µm. In embodiments, a width of the channel is from 1 to 100 nm, such as from 1 to 50 nm, or 1 to 20 nm. In embodiments, a width of the particles is from 1 to 100 nm, such as from 1 to 50 nm, or from 1 to 10 nm. For longer channels, a smaller width of the channels and a smaller width of the particles may be used, so that a data storage density of the memory device may be increased. In embodiments, a pitch of a plurality of parallel channels of same dimensions is at least larger than the width of a channel. In embodiments, a pitch of a plurality of parallel channels of same dimensions is at most equal to twice the width of a channel.

In embodiments, a reservoir is fluidically coupled to the at least one channel, wherein the reservoir includes some of the fluid, and wherein the actuator is adapted for inducing a movement of the particles between the reservoir and the channel. In embodiments, the channel is fluidically coupled to the reservoir at a first end of the channel. In embodiments, the channel includes an entrance at the first end of the channel. In embodiments, the entrance can have spatial dimensions suitable for the particles to move through the entrance. In embodiments, fluidically coupled includes that the fluid is able to move between the reservoir and the channel. In embodiments including a plurality of channels, each of the channels may be coupled to the reservoir at a first side of the reservoir, that is, the entrance of each of the channels may be located at the first side of the reservoir. Advantageously, in these embodiments, for instance, the writing element and/or reading element may be shared between adjacent channels, such as between multiple channels, such as between channels within an array, a row, or a column of channels. In embodiments, the dimensions or the shape of the reservoir are not limited. In embodiments, spatial dimensions of the reservoir are larger than spatial dimensions of the particles to such an extent that particles can pass each other in the reservoir. Therefore, in embodiments, in the reservoir, the particles may be randomly distributed, that is, the particles may not be restricted to a sequence, or to a region within the reservoir. Therefore, in embodiments, the reservoir is unsuitable for preserving a sequence of particles corresponding to stored information, that is, the particles may not be used for data storage as long as they are present in the reservoir. Advantageously, the reservoir provides a large supply of the particles to be arranged in a sequence in the channel. Furthermore, in embodiments, the reservoir provides room for the particles to move past each other. Advantageously, in these embodiments, the writing element may arrange the particles in a sequence in the channel, without being restricted, for example, limited, to any order or sequence of the particles in the reservoir.

In embodiments, the actuator may be adapted to induce the movement of the particles, wherein the movement of the particles is accompanied by a movement of the liquid. This may for instance be the case when the actuator is configured to induce the movement by dielectrophoresis or by a fluid dragging force. In embodiments, in addition or alternatively to the reservoir, the memory device includes a further reservoir. In embodiments, the further reservoir is fluidically coupled to a second end of the channel. In these embodiments, the second end of the channel includes an opening adapted for the liquid to move between the channel and the further reservoir, but prevents the particles from moving between the channel and the further reservoir. For instance, a width of the opening may be smaller than a width of the particles, that is, the opening may be constricted. Alternatively or additionally to the opening being constricted, the adapted opening may have a nonzero zeta potential with a same sign as a nonzero zeta potential of the particles, so that the particles are repelled by the constricted opening. In certain embodiments, the further reservoir does not include particles. In absence of a further reservoir, upon movement of the liquid from the first end of the channel to the second end of the channel, pressure may build up at the second end of the channel, wherein a force exerted by the pressure at the second end on the liquid and the particles may negate a force exerted by the actuator on the liquid and the particles in the opposite direction. Consequently, the particles may at some point in time end up being prevented from moving through the channel. The presence of the further reservoir is therefore advantageous. Advantageously, as fluid may move between the channel and the further reservoir through the adapted opening at the second end of the channel, a build up of pressure at the second end may be limited.

In embodiments including the reservoir and the further reservoir, the memory device may include a recycling column, different from the channel, between the reservoir and the further reservoir, for moving fluid between the reservoir and the further reservoir, not through the channel. In embodiments, the recycling column may have a larger width than the channel. In embodiments, the device is configured so that activation of the actuator does not induce a movement of the particles in the recycling column and/or between the recycling column and the reservoir. In these embodiments, the particles may not move into the recycling column. This is advantageous because this prevents reducing the number of particles in the reservoir and in the channel. In embodiments, the recycling column may include a filter to prevent movement of the particles from the reservoir into the recycling column. In embodiments, advantageously, the recycling column may prevent any pressure difference between the reservoir and the further reservoir. Thereby, the recycling column may prevent any pressure difference building up between the first end of the channel and the second end of the channel, which could potentially prevent the movement of the particles in the channel.

In embodiments, the actuator may be configured to induce the movement by electrophoresis, dielectrophoresis, a fluid-dragging force, a magnetic force, or an electrical force, or by a combination thereof. However, the disclosed technology is not limited thereto: in embodiments, the actuator may, instead or additionally, be configured to induce the movement by a nonlinear electrokinetic phenomena, such as AC or induced-charge electro-osmosis, induced-charge electrophoresis, or combinations thereof. Herein, the movement may include the movement of the particles, such as the movement of the particles in the channel, and, in embodiments including the reservoir, the movement of the particles between the channel and the reservoir.

The actuator may include any means suitable for inducing a movement of the particles. In embodiments, the actuator includes a microfluidic pump. For instance, the microfluidic pump may be included in the recycling column connecting the reservoir with the further reservoir. Thereby, the microfluidic pump may build up pressure between the ends of the channels, which causes the fluid to flow through the channels. The fluid flow may drag the particles along. In particular embodiments, the actuator includes coils. In certain embodiments, the actuator includes at least two electrodes for generating an electric field. In embodiments, the electric field, directly or indirectly, exerts a force on the particles, thereby inducing the movement of the particles. In embodiments, the channel is located between the at least two electrodes, so that the electric field can be generated, hence the movement can be induced, in the channel. In embodiments, the electric field is aligned parallel to the longitudinal axis of the channel, so that the movement that is induced by the actuator may be parallel to the longitudinal axis of the channel. In embodiments including the reservoir, the reservoir can be located between the at least two electrodes, so that the electric field can be generated, hence the movement can be induced, in the reservoir.

In embodiments, a first electrode of the actuator is located at a first end of the channel. In embodiments including the reservoir, the first electrode may be located in the reservoir or in a wall of the reservoir. In embodiments wherein the at least one channel is fluidically coupled to the first side of the reservoir, the first electrode may be located at a second side of the reservoir opposite to the first side of the reservoir. In embodiments, a second electrode of the actuator is located at a second end of the channels different from the first end of the channel. In embodiments, the second electrode is not included in the channel, but is spatially separated from the channel. For instance, in embodiments including the further reservoir, wherein the at least one channel is fluidically coupled to the further reservoir at a first side of the reservoir, the second electrode may be included in a wall of the further reservoir at a second side opposite to the first side.

In embodiments including the plurality of channels, each of the plurality of channels may include a first electrode element. In embodiments including the plurality of channels, each of the plurality of channels may include one second electrode element. Advantageously, in these embodiments, each channel may be addressable separately from other channels, for instance by only generating an electric field between one first electrode element and one second electrode element. Thereby, it may be possible to move particles in only one of the plurality of channels but not in another of the plurality of channels.

In embodiments, the actuator is configured to induce the movement by electrophoresis. In these embodiments, the actuator may include the electrodes, wherein the electrodes are configured to generate a direct current (DC) electric field. In these embodiments, the particles can have a net charge or are dipolar particles. In embodiments, by generating the DC electric field between the first electrode and the second electrode, the movement may be induced.

In embodiments, the electrodes may include a Faradaic electrode, that is, an electrode wherein a Faradaic process occurs at its surface. This is advantageous because it prevents the charge accumulation that may occur upon generation of the DC electric field. Upon generation of the DC electric field, not only the particles may move, but furthermore, any ions, for example, salt buffer may also move, resulting in build-up of a charge accumulation, so that a secondary (that is, an opposing) electric field opposing the DC electric field may be developed. The opposing electric field may negate the DC electric field, so that the particles do not move in response to the generated DC electric field.

In these embodiments, the fluid may include a reversible redox couple. Reversible redox couples include an ion that may be reversibly, that is, cyclically, reduced and oxidized, and that reacts at the Faradaic electrode via a redox reaction. The Faradaic process thereby may reduce (for example, prevent) the charge accumulation build-up at the Faradaic electrode, thereby possibly reducing (for example, preventing) the generation of the secondary electric field.

In embodiments, an ion reservoir element may be included in the memory device. The ion reservoir element may increase or decrease the ion concentration (for example, the concentration of the reversible redox couple) in the liquid. For example, the ion reservoir element may include helping electrodes. The helping electrodes may include a metal that may be brought into solution by electrodissolution, or ions from the solution may be deposited from the solution onto the helping electrode by electrodeposition. Alternatively, the ion reservoir element may include a porous material, wherein the ions may be stored inside pores of the porous material. For example, the porous material may include a nanomesh or a metal-organic framework.

In embodiments, the electrodes may be operated such that the integrated ionic currents (that is, the movement of the ions) through the fluid equals zero. When driving current for a long time one way through the electrodes, eventually all metals of one electrode may be dissolved. By reversing the current, ions may be deposited on the one electrode. By operating the electrodes such that the integrated ionic current equals zero, on average, the electrode thickness may remain the same. In these embodiments, the electrodes may be configured so that the electrodes operate with a balancing time period for balancing the ion movement. For instance, between subsequent read and/or write operations, or after a number of read and/or write operations, or after a certain operation time, the balancing time period is inserted so that the ions may re-equilibrate. Advantageously, if during a write or read operation, there is a net movement of the ions, for example, from the first electrode to the second electrode, the electrodes may be operated during the time period for balancing the ion movement such that there is a net movement of the ions from the second electrode to the first electrode, thereby negating any charge accumulation. The balancing of the ion movement may be achieved actively: for instance, during the balancing time period, an electric field may be generated by the electrodes, said electric field being opposite to the potential of the read or write operation prior to the balancing time period. In embodiments, the electrodes have a charge storage capacity of from 1 mC/cm$^2$ to 1000 mC/cm$^2$, such as from 10 mC/cm$^2$ to 1000 mC/cm$^2$, or from 100 mC/cm$^2$ to 1000 mC/cm$^2$. Thereby, ion charge may be accumulated at the electrodes during the read or the write operation, without the accumulated charge negating the generated DC electric field.

In embodiments, the fluid may include a polar solvent having an ionic strength of from 1 nM to 100 mM, such as from 10 nM to 10 mM, from 100 nM to 1000 µM, or from 1 µM to 10 µM. In embodiments, the liquid includes a non-polar liquid. Advantageously, in these embodiments, charge accumulation may be limited and the need for inserting the balancing time period may be minimal or nil.

In embodiments, the actuator is configured to induce the movement by dielectrophoresis. Advantageously, inducing the movement by dielectrophoresis allows exerting a force, that is, a dielectrophoresis force, on dielectric particles. Therefore, dielectrophoresis may be highly suitable for many types of particles. In embodiments, the actuator may include the electrodes. In embodiments, the actuator is configured to generate a non-uniform electric field. For generating a non-uniform electric field, the electrodes may for instance have a different size or shape. In embodiments, the dielectrophoresis force exerted on the particle depends on dielectric properties of the particle, relative to dielectric properties of an environment of the particle. In embodiments, the actuator is configured to generate an alternating current (AC) electric field. As dielectric properties may be frequency-dependent, the dielectrophoresis force may depend on a frequency of the applied electric field.

In embodiments, one type of particles has a dielectric constant that is lower than the dielectric constant of an environment (for example, the fluid) of said one type of particles, and another type of particles has a dielectric constant that is higher than the dielectric constant of an environment (for example, the fluid) of said another type of particles. In embodiments, the actuator is configured to generate an inhomogeneous field that may have a highest field at one electrode, and a lowest field at another electrode: then, the highest field attracts the another type of particles, while repelling the one type of particles. Advantageously, in embodiments, the actuator is adapted to selectively induce a movement of the one type of particles in a first direction, and induce a movement of the other type of particles in a second direction.

In embodiments including the first particles and the second particles, each particle may be homogeneous. Advantageously, the frequency dependence of the dielectrophoresis force exerted on the homogeneous particles may be relatively straightforward. In certain embodiments, the first particles and the second particles have a core and a shell, wherein the core and the shell have a dielectric constant different from the dielectric constant of the fluid, wherein the material of the shell of the particles is charged in the fluid, wherein the zeta potential of the material of the shell is the same for the first and the second particle, and wherein the dielectric constant of the material of the core of the first particles differs from the dielectric constant of the core of the second particles. That is, in these embodiments, the first particles and the second particles are core-shell nanoparticles. In embodiments, the shell and the core of each particle type include a different material. In embodiments, the core of the first particles and the second particles includes a different material. In embodiments, the shell of the first particles and the second particles includes a different material. In embodiments wherein the core of the first particles and the second particles include a different material and wherein the shell of the first particles and the second particles include a different material, the core and the shell of the first and the second particles may be adapted so that a zeta potential of the first particles is equal to a zeta potential of the second particles. In embodiments, the shell includes a dielectric material. In embodiments, the material of the core includes a metal or a heavily doped semiconductor. In embodiments, the radius of the first particles and of the second particles is different. As is for instance explained in D. Kim et al., Analytical Chemistry 91 (2018) pages 277-295, for core-shell nanoparticles, the dielectrophoresis force exerted on the particle may depend on a radius of the core and on a radius of the shell. Furthermore, the dielectrophoresis force exerted on the particle depends on the dielectric constant of the core and on the dielectric constant of the shell of the particle, and on the dielectric constant of the environment of the particle. Therefore, advantageously, the dielectrophoresis force exerted on the particle may be very different for different frequencies of the AC electric field. Therefore, advantageously, the dielectrophoresis force exerted on the particle may be very different for the different types of particles. As a consequence, advantageously, by appropriate choice of material of the core and of the shell, and by appropriate choice of the diameter of the core and of the shell, and furthermore by appropriate choice of the frequency of the electric field the actuator is configured to generate, the actuator may be configured to only induce a movement of one of the types of particles. In addition, which particles are induced to move may strongly depend on the frequency of the AC electric field. Hence, for instance, in embodiments including the core-shell particles, the actuator may be configured so that at a first frequency, only the first particles are induced to move, whereas as a second frequency, only the second particles are induced to move, whereas at a third frequency, all particles are induced to move. At the first frequency, the second particles may be induced to move in a direction different, for example, opposite to the direction in which the first particles move. At the second frequency, the first particles may be induced to move in a direction different, for example, opposite to the direction in which the second particles move. The movement of a particle in response to the AC field may depend on a Clausius-Mossotti factor of the particle, which is further described below.

In embodiments, the first particle and the second particle differ in size. In embodiments, the composition of the first and the second particles is the same, but the radius of the first particles and of the second particles is different.

In embodiments, the actuator is configured to induce the movement by a fluid-dragging force, for example, electro-osmosis. In these embodiments, the actuator may include the electrodes. In these embodiments, the walls of the channel may have a non-zero zeta potential, that is, a non-zero surface charge. For example, as a result of the non-zero zeta potential, the fluid near the wall may mainly include ions including a charge with a first sign. In embodiments, on application of an electric field by the actuator, the ions start moving in a first direction of the electric field, thereby generating a flow of the fluid in proximity of the wall in the first direction. In embodiments, the flow of the fluid may drag the particles in the proximity in the first direction, thereby inducing the movement of the particles. In embodiments, inverting the direction of the electric field results in an inversion of the direction of the movement of the particles. In embodiments wherein the actuator is configured to induce the movement by electro-osmosis, the memory device may include the ion reservoir element. Advantageously, the ion reservoir element may be used to control the concentration of ions in the liquid. As the electro-osmosis drag force may depend on the ion concentration, the ion reservoir element may be used to control the electro-osmosis.

In embodiments wherein the actuator is configured to induce a movement by the fluid-dragging force, for example, the electro-osmotic drag force, the actuator may at the same time be configured to induce a movement by electrophoresis. In embodiments, the particles have the same zeta potential as the wall of the channel, for instance because the particles and the walls include the same materials. In these embodiments, the electro-osmotic drag force acting by the fluid on the particles may be opposite to the electrophoretic force acting on the particles themselves, but have a different magnitude so that a sum of the forces is imbalanced, that is, nonzero. In embodiments, the shape and the material of the wall and the particles may be optimized to maximize the imbalance, so that the sum of the forces results in the movement of the particles in a desired direction.

In embodiments, the actuator is configured to induce the movement by a magnetic force. For instance, the actuator may include a coil or wire for generating a magnetic field to exert a magnetic force on the particles. In embodiments, the particles include self-propelled particles, such as for example described in K. Han, Advanced Functional Materials 2018, 28, 1705953. In these embodiments, the actuator is configured to induce the movement by magnetic force or electrical force.

In embodiments, the writing element is located at the first end of the channel. In embodiments, the writing element is included in the wall of the channel. The writing element is adapted for arranging in a sequence the particles. In embodiments including the first particles and the second particles, the arranging may include that the writing element is adapted to cyclically let one of the first particles or second particles enter into the channel, wherein the particle that is let to enter into the channel is required for the sequence in the channel. In embodiments including the particles that can be in the first state and in the second state in the channel, the arranging may include that the writing element is adapted to cyclically set one particle in the first state or the second state and let the one particle enter into the channel, wherein the particle in the state that is let to enter into the channel is required for the sequence in the channel. In embodiments, in each cycle, a particle is added to the sequence of particles in the channel.

In embodiments, wherein the particles include the first particles and the second particles, the writing element may be adapted to determine which particle moves into the channel. In embodiments, the writing element is an electronically controlled gate. In embodiments, the electronically controlled gate is configured so that it can selectively let one type of particle into the channel but not another type of particle. In embodiments, the electronically controlled gate may be configured so that one particle at a time may pass through the electronically controlled gate.

In embodiments, the electronically controlled gate includes an electrostatic barrier. In embodiments, the electrostatic barrier is configured to, in a closed state of the electrostatic barrier, block at least one type of particle, such as all types of particles. In embodiments, the electrostatic barrier includes a barrier electrode for generating a field for repelling the at least one type of particles, such as all particles. In embodiments, the electrostatic barrier includes a dielectric material with a nonzero zeta potential that has an opposite sign than a nonzero zeta potential of the at least one type of particles, such as of all particles. Thereby, the at least one type of particles, such as all particles, is electrostatically repelled by the dielectric material, that is, by the electrostatic barrier. In the closed state of the electrostatic barrier, if the repulsion is sufficiently large, for example, due to a sufficiently large nonzero zeta potential of the dielectric material, the at least one type of particle, such as all particles, is unable to pass the electrostatic barrier. Thereby, in embodiments, in the closed state, the at least one type of particles, such as all particles, that is in the channel cannot leave the channel, and the at least one type of particles, such as all particles, that is not in the channel cannot enter the channel. In embodiments, the electrostatic barrier further includes an electrode. In these embodiments, the electrode may be configured to generate an electric field opposing the electrostatic repulsion. In these embodiments, the electrostatic barrier may be opened by the application of the electric field. Thereby, in the opened state of the electrostatic barrier, the at least one type of particles may pass the electrostatic barrier, that is, move between the reservoir and the channel.

In embodiments, the actuator is adapted to move a random particle from the reservoir to an entrance to the channel, wherein the writing element is adapted to detect which particle is present at the entrance. In these embodiments, if the writing element detects that the particle is required for the sequence in the channel, the writing element may be configured to let the particle enter into the channel. In these embodiments, if the writing element detects that the particle is required for the sequence in the channel, the writing element may be configured to move the particle away from the channel.

In embodiments, the electronically controlled gate includes a gate reading element for detecting that a particle is present in the electronically controlled gate. In embodiments, the gate reading element is adapted to detect the type of particle that is present in the electronically controlled gate. Advantageously, the detecting of the type of particle in the electronically controlled gate may be used to detect writing errors. In embodiments, the gate reading element and the electrostatic barrier may be configured so that the electrostatic barrier is opened when the gate reading element detects that a particle to be added to the sequence of particles in the channel is present in the electronically controlled gate. In embodiments, the electrostatic barrier may be configured to subsequently close when the gate reading element detects that the particle has moved passed the electrostatic barrier, further into the channel.

In embodiments, the gate reading element includes the reading element. In these embodiments, the gate reading element may be an addressing element, as it may perform functions related to addressing data, that is, both writing of data and reading of data and possibly storing of data. Advantageously, in these embodiments, only a single reading element is required in the channel. In embodiments, the gate reading element is not the reading element. Advantageously, in embodiments, although the writing element, and therefore the gate reading element, may be included at the entrance of the channel, the reading element may be included at a different location in the channel. In embodiments, in particular in embodiments including the reservoir, if the reading element is at the entrance of the channel, detecting the sequence of particles by the reading element may result in losing the sequence of particles, for example, as the particles move from the channel into the reservoir during the detecting of the sequence. In embodiments, at least some of the features of the gate reading element may be identical to at least some of the features possible for the reading element. In embodiments, the gate reading element includes the same features as the reading element. Advantageously, the gate reading element may be used to check that a particle of choice is moved into the channel.

In embodiments, the electronically controlled gate includes a gate actuator. In embodiments, the gate actuator is adapted to induce a movement of at least one type of the particles, such as all particles, at least at the entrance of the channel, close to the writing element. In embodiments, the gate actuator includes at least a first electrode at the entrance of the channel. In embodiments, the gate actuator includes a second electrode. In embodiments, the gate actuator is configured to generate an electric field between the first and second electrodes of the gate actuator. In embodiments, the gate actuator is configured to be able to attract all particles or a single type of particle. In embodiments, the gate actuator is configured to be able to repel all particles or a single type of particles. In embodiments, an electric field may be generated between an electrode of the gate actuator and an electrode of the actuator to induce a movement of the particles. In these embodiments, the gate actuator and the actuator may be adapted to induce a movement of at least one type of the particles, such as of all types of particles, such as in the reservoir or in the channel, towards or away from the channel. In embodiments, the gate actuator is adapted to induce the movement by means that are also available for the actuator, for example by electrophoresis and/or dielectrophoresis. Advantageously, in embodiments including the reservoir, upon application of an electric field between the first and second electrode of the gate actuator, the gate actuator may be used to attract a single type of particles from the reservoir to the entrance of the channel. Advantageously, the gate actuator may be used to repel other types of particles than the single type of particles. Thereby, the gate actuator may be used to facilitate the arranging in a sequence of the particles, by attracting the type of particle that is required in the sequence in the channel to the channel where the type of particle that is required is required.

In addition, advantageously, the gate actuator may be adapted to induce a movement of a particle within the electronically controlled gate. In embodiments, the gate actuator may be configured to move the particle within the electronically controlled gate from or to the gate reading element. In embodiments, if the electrostatic barrier is opened, the gate actuator may be configured to move the particle within the electronically controlled gate through the electrostatic barrier, into the channel. Advantageously, the gate actuator may be used to induce the movement of particles in the writing element. However, in embodiments, the gate actuator is not required: the movement of the particles in the writing element may also be induced by the actuator.

In embodiments, the writing element is adapted for ensuring that exactly a single particle at a time moves into the channel. In embodiments, the gate actuator may include the first electrode and the second electrode, wherein the first electrode is closer to the entrance of the channel than the second electrode, and wherein the second electrode is included between the first electrode and the electrostatic barrier. In embodiments, the distance between the first electrode and the electrostatic barrier, may be sufficient to include a single particle in the channel. In embodiments, the gate actuator is configured to, if the single particle is present in the writing element, generate an electric field so that the first electrode repels all particles, whereas the second electrode attracts all particles. In embodiments, due to the limited size of the second electrode, only the single particle remains in the writing element. Alternatively, in embodiments, the writing element may include a waiting channel between the gate actuator and the electrostatic barrier, the waiting channel having a length suitable for including a single particle. In embodiments, the gate actuator may be configured to, if a single particle is present in the waiting channel, generate an electric field to repel all particles. Thereby, all other particles than the single particle may be induced to move away from the writing element, so that only the single particle is present in the writing element, that is, in the waiting channel. In embodiments, the gate actuator is, if the electrostatic barrier is opened, configured to generate an electric field for repelling the single particle, so that the single particle is induced to move past the electrostatic barrier, further into the channel.

In embodiments wherein the particles include dipolar particles, the memory device may further include a space, fluidly coupled to the channel and large enough for enabling inverting the orientation of a dipolar particle, while remaining small enough to preserve the sequence of the particles, wherein the writing element is configured for inverting the orientation of a dipolar particle present in said space. That is, on application of a field by the writing element, the dipolar molecule in the space may align in response to the field. In embodiments, the actuator is adapted to induce a movement of the particles in the space. In embodiments, the space is located between the first electrode and the second electrode of the actuator. In embodiments, the actuator is adapted to induce a movement of the particles between the space and the channel. In embodiments including the reservoir, the actuator is adapted to induce a movement of the particles between the space and the reservoir. In embodiments including the reservoir, the space may be located between the channel and the reservoir. In embodiments, the space includes a spherical cavity. In embodiments, the space is adapted to include only a single particle, that is, the space may be too small to include more than one particle. In embodiments, the writing element includes the gate reading element for detecting the presence and/or the orientation of the dipolar particle. In embodiments, the writing element includes the electrostatic barrier. In embodiments, the writing element includes the gate actuator for inducing a movement of the dipolar particle.

In embodiments, the space is fluidically coupled to a further channel including some of the fluid. In embodiments, the further channel has the same width as the channel. In embodiments, the longitudinal axis of the channel and a longitudinal axis of the further channel are oriented along a shared axis. In embodiments, the space is located between the channel and the further channel. In embodiments, the actuator is adapted to induce a movement of particles in the further channel. In embodiments, the further channel is located between the first electrode and the second electrode of the actuator. In embodiments, the actuator is adapted to induce a movement of particles between the further channel and the space. Advantageously, as the channel and the further channel are aligned along the same axis so that the particles can only move in a single direction, a movement between the channel and the further channel may be comparatively fast.

In embodiments including the particles including the first state and the second state in the channel, the actuator and/or the gate actuator are configured to induce a movement of the particles to the entrance of the channel, such as into the space. In embodiments, the actuator and/or the gate actuator are configured to induce, after the particle is set in the space in the orientation required for the sequence in the channel, a movement of the particle in the space toward the channel. In embodiments further including the electrostatic barrier, after setting the particle in the required state, the writing element is configured to open the electrostatic barrier to let the particle into the channel.

In embodiments, the memory device includes an electroplating electrode, for example at an entrance of the channel. In embodiments, the electroplating electrode is configured for plating, that is, electrodepositing, a metal on a surface of the electroplating electrode. For example, the electroplating electrode may be used to reduce ions in the liquid, that thereby become plated on the electroplating electrode. Advantageously, by plating the metal, the entrance of the channel may become constricted, so that particles may not be able to move through the entrance. Thereby, the particles may be stored in the channel for a time without applying power to the memory device during the time.

In embodiments, the reading element is configured to either detect the particles moving from the reservoir into the channel, or detect the particles moving between a first part of the channel and a second part of the channel. In embodiments, the reading element is included in the wall of the channel. In embodiments including the space, the reading element may be included in a wall of the space. In embodiments, the reading element is located at the entrance of the channel. In these embodiments, the reading element is configured to detect the particles moving in or out of the channel. In these embodiments, in embodiments further including the reservoir, detecting of the sequence of particles in the channel may result in loss of the sequence of particles. In different embodiments, the reading element is located away from any end of the channel, for instance halfway along the channel. Alternatively, the reading element may include a reading channel, wherein the reading channel is included between the channel and the reservoir. In these embodiments, the reading element is configured to detect the particles moving between the first part of the channel and the second part of the channel. In embodiments, the reading element is adapted to detect the presence of the particles. Furthermore, in embodiments, wherein the particles include first particles and second particles, the reading element is adapted to distinguish between the first particles and the second particles. In different embodiments, wherein the particles can be in a first state and in a second state, the reading element is adapted to distinguish between the first state of the particles and the second state of the particles.

In embodiments, the reading element includes a capacitor or a field-effect transistor, or is configured for detecting a magnetic field. In embodiments wherein the reading element includes the capacitor, the capacitor may include a first capacitor plate and a second capacitor plate. In embodiments, the first plate may be located in the wall of the channel on a first side of the channel, and the second plate may be located in a wall of the channel on a second side of the channel opposite to the first side of the channel. In embodiments, the capacitor includes a first capacitor plate in the wall of the channel at a first location, and a second capacitor plate in the wall of the channel at a second location, wherein the first location is closer to the entrance of the channel than the second location. In embodiments, a dielectric constant of the particles is different from a dielectric constant of the liquid in which the particles are dispersed. In these embodiments, a capacitance of the capacitor depends on whether a particle is present between the first plate and the second plate. In embodiments, the first and second particles have different dielectric properties, and the reading element includes the capacitor. In these embodiments, the capacitance of the capacitor may be different when the first particle is present between the first plate and the second plate than when the second particle is present between the first plate and the second plate. Therefore, in embodiments, by measuring the capacitance of the capacitor, it is possible to determine whether a particle is present between the first plate and the second plate, and if there is a particle present, what type of particle is present.

In embodiments wherein the reading element includes the field effect transistor, a surface of a gate of the field effect transistor may be exposed to fluid in the channel. In embodiments, the field effect transistor is adapted to detect the charge of particle in the proximity of the gate. In embodiments wherein the first particles have a different charge than the second particles, the field effect transistor is suitable to differentiate between the first particles and the second particles.

In embodiments, the reading element is configured for detecting a magnetic field. In these embodiments, the reading element may include a magnetometer. In embodiments, the reading element includes a Hall sensor or a magnetoresistive element, such as a magnetic tunnel junction, a giant magnetoresistance sensor or an anisotropic magnetoresistance sensor. Amongst the magnetoresistive elements, the magnetic tunnel junction may be reliable, small, and very sensitive. In particular embodiments, the reading element may include a Josephson junction or make use of nitrogen-vacancy-centers in diamond. These particular embodiments may allow for a very high sensitivity towards magnetic fields. In embodiments including the dipolar particles, the dipolar particles may generate the magnetic field, which may be detected by the reading element. On inversion of the orientation of a dipolar particle in the channel, also the magnetic field is inverted. Therefore, by detecting the direction of the magnetic field generated by the dipolar particle, the orientation of the dipolar particle in the channel may be determined by the reading element.

In embodiments, the memory device includes a control circuit. In embodiments, the actuator is electrically coupled to a first control circuit. In embodiments, the writing element is electrically coupled to a second control circuit. In embodiments, the reading element is electrically coupled to a third control circuit. In embodiments, the first, second, and third control circuits are included in a single control circuit. In embodiments, the control circuit includes a voltage source. In embodiments, the control circuit includes a microcomputer. In embodiments, the control circuit is a CMOS control circuit. In embodiments, the control circuit is for controlling the memory device. Thereby, in embodiments, the control circuit may be configured to induce the execution of the reading operation and/or of the writing operation in the memory device.

Any features of any embodiment of the first aspect may be independently as correspondingly described for any embodiment of the second aspect of the disclosed technology.

In a second aspect, the disclosed technology relates to a method for making the memory device, including: a) obtaining at least one channel, b) filling the channel with a fluid including particles, wherein either: i) the particles include first particles and second particles, or ii) the particles can be in a first state or a second state in the channel, c) providing the device with an actuator suitable for inducing a movement of the particles in the channel, d) providing the device with a writing element suitable for arranging in a sequence the particles, thereby yielding a sequence of particles in the channel, and e) providing the device with a reading element for detecting the sequence of the particles in the channel, wherein the channel is adapted to preserve the sequence of the particles.

Any features of any embodiment of the second aspect may be independently as correspondingly described for any embodiment of the first aspect of the disclosed technology.

The disclosed technology will now be described by a detailed description of several embodiments of the disclosed technology. It is clear that other embodiments of the disclosed technology can be configured according to the knowledge of persons skilled in the art without departing from the technical teaching of the disclosed technology.

Example 1: Memory Device with First and Second Particles

Reference is made to FIG. 1. In a first example, the memory device includes an array, that is, a plurality, of channels 11 that connect a reservoir 10 with a further reservoir 12. Furthermore, a recycling column 14, having a width that is larger than a width of each of the channels 11, connects the reservoir 10 with the further reservoir 12. The reservoir 10, the channels 11, the recycling column 14, and the further reservoir 12 include the fluid. In this example, the fluid contains first particles 130 and second particles 131, which act as the carriers of information as they are stored in a sequence in the channels 11. The width of the channel 11 is limited, and furthermore, a zeta potential of the wall of the channel 11 has the same sign as a zeta potential of the particles 130 and 131, so that particles 130 and 131 in the channel cannot pass each other. The particles 130 and 131 are dispersed in a liquid. The particles 130 and 131 can only enter the channel 11 via an entrance 111 at a first end of each of the channels 11. At a second end of each of the channels 11, the channel 11 includes a constricted opening 113 that is, in this example, spatially constricted so that particles 130 and 131 cannot pass. The liquid may pass through the constricted opening 113.

An actuator includes a first electrode 151 on a second side of the reservoir 10, opposite to a first side of the reservoir 10 including the entrances to the channels 11; and a second electrode 152 on a second side of the further reservoir 12 opposite to a first side of the further reservoir 12 including the constricted opening 113 of the reservoir. All channels 11, large part of the reservoir 10, and large part of the further reservoir 12 are located between the first electrode 151 and the second electrode 151. The actuator is configured for inducing a movement of the particles 130 and 131.

The actuator 151, 152 includes means for inducing a movement of the particles via electroosmosis in the channel: the electric field that initiates electroosmotic flow is generated by the first electrode 151 and the second electrode 152, wherein the electrodes are Faradaic electrodes.

An addressing element, that is a writing element 112, including a reading element 1121, is included at the first end of each channel 11. In this example, the writing element 112 includes a stack of four electrodes. In this example, the actuator and the writing element are electrically coupled to a circuit 16 for electrically controlling of the electrodes 151 and 152 of the actuator, and of the four electrodes of the writing element 112.

Figure 2:
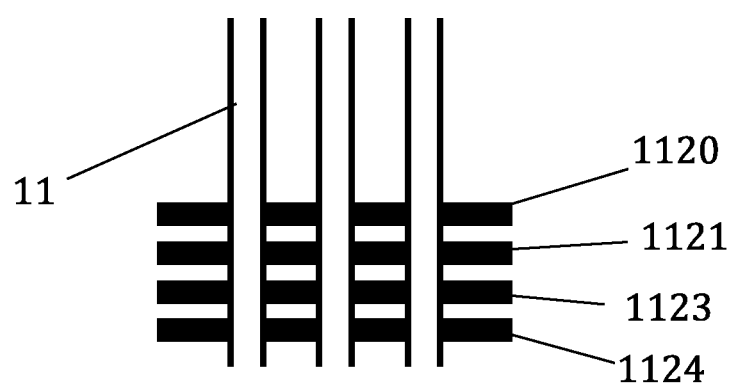
FIG. 2 is a vertical cross-section of a memory device according to embodiments of the disclosed technology.

Reference is made to FIG. 2, which shows a side view of the writing element 112. In this example, the writing element 112 is an electronically controlled gate. In this example, the writing element includes an electrostatic barrier 1120 and a gate reading element which is the reading element 1121. Instead of the electrostatic barrier 1120, however, an electrodeposition gate could be used. In this example, the writing element includes a gate actuator including a first electrode 1124 and a second electrode 1123.

The reading element 1121 may include a capacitor for detecting the particle. The detecting includes measuring a capacitive change caused by the different permittivities of the two types of particles. In certain embodiments, the reading element 1121 may include an electrode, acting as a first plate of a capacitor, wherein for instance the second electrode 1123 of the writing element acts as a second plate of the capacitor: the reading element 1121 then detects the change in capacitance between the reading element 1121 and the second electrode 1123 of the writing element.

Figure 3A:
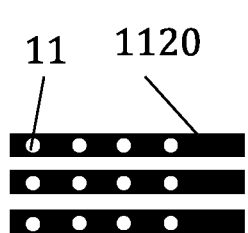
FIG. 3A, FIG. 3B, and FIG. 3C are cross-sections of channels and parts of an addressing element according to embodiments of the disclosed technology.
Figure 3B:
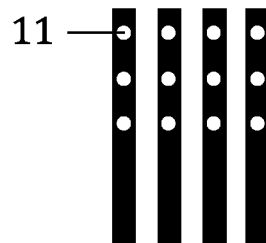
Figure 3C:
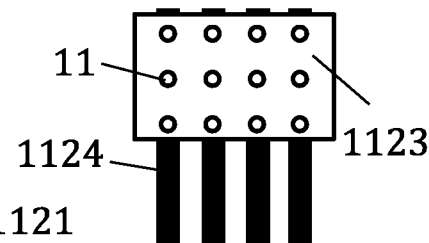

Reference is made to FIG. 3, which shows a top view of the channels 11, of which three rows and four columns are shown, and each of the electrodes of the writing element 112. In this example, all channels included in a single row share a single electrostatic barrier 1120. In this example, all channels included in a single column share a single reading element 1121, and, in addition, a single first electrode 1124. The first electrode 1124 is for selectively attracting a particle 130 or 131. For example, an AC electric field may be generated by the first electrode 1124 of the writing element, thereby selectively attracting one type of particle 130 or 131 via dielectrophoresis. The AC electric field may for instance be generated between the first electrode 1124 of the writing element and the first electrode 151 of the actuator. The alignment of the electrostatic barrier electrode 1120 is perpendicular to the alignment of the first electrode 1124. Within one row, each channel can be individually addressed by the first electrode 1224 for selectively attracting a particle 130 or 131. Therefore, within the one row, each channel 11 may attract a different type of particle. The electrostatic barrier 1120 may be opened to allow all particles attracted by the first electrode 1124 to enter the channel. Therefore, the perpendicular alignment of the electrostatic barrier electrode 1120 and of the first electrode 1124 allows for arranging in a sequence the particles in all of the channels 11 included in the one row at the same time. Sharing electrodes of the writing element 112 between adjacent channels 11 may simplify the manufacturing of the memory device. For a similar reason, the electrostatic barrier 1120 electrode and the reading element 1121 electrode are aligned perpendicular to each other: for reading the sequence of particles 130 and 131 in the channel 11, the electrostatic barrier 1120 may be opened and the actuator 151 and 152 may induce the movement of the particles 130 and 131 in the channel 11 out of the channel 11, past the reading element 1121, which may then detect the sequence of the particles 130 and 131 in each of the channels 11 in the row individually. The read operation is destructive, since it requires all particles to pass by the reading element 1121, and therefore flow out of the channels. A re-write may be required after the read operation.

Reference is made to FIG. 4A-D, which are schematic representations of steps of a write operation. The electrodes of the writing element are aligned as in FIG. 3, and a single row of channels 11 is shown.

Figures 4A, 4B, 4C, 4D:
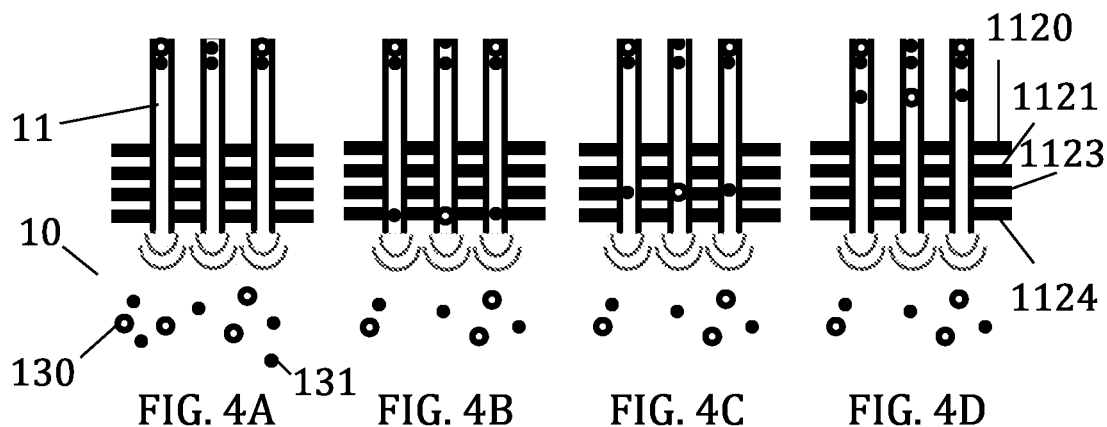
FIG. 4A, FIG. 4B, FIG. 4C, and FIG. 4D are schematic representations of steps of a writing operation in a memory device according to embodiments of the disclosed technology.
Figure 5:
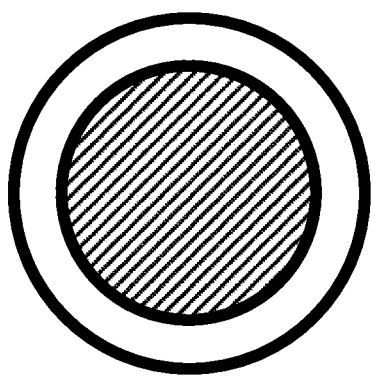
FIG. 5 is a cross-section of a core-shell particle according to an embodiment of the disclosed technology.

Reference is made to FIG. 4A. To initiate the write operation, a row of channels 11 may be opened with the corresponding electrostatic barrier electrode 1120. The first electrode 152 and the second electrode 151 of the actuator induce an electro-osmotic flow in the channels 11, thereby inducing a movement of the particles 130 and 131 from the reservoir into the channel. At the same time, the first electrode 1124 generates an AC electric field, either for attracting the first particle 130 and repelling the second particle 131, or for repelling the first particle 130 and attracting the second particle 131. That is, the type of particle 130 and 131 that enters each channel 11 is determined by the frequency of the AC signal generated by the select first 1124 of the channel.

Reference is made to FIG. 4B. After some time, each 11 channel in the row that is being written will, with a high probability, have a particle 130 and 131 of the appropriate type trapped at the select electrode 1124.

Reference is made to FIG. 4C. Next, an AC signal for attracting all particles 130 and 131 is applied to the second electrode 1123 of the writing element, while the first electrode 1124 of the writing element generates an AC signal for repelling all particles 130 and 131. This will cause the particle 130 and 131 in each channel to move towards the second electrode 1123 of the channel 11, while any other particles 130 and 131 that may have partially entered or come close to the channel 11 are repelled into the reservoir 10. Thereby, only a single particle 130 or 131 is able to enter the channel 11.

Reference is made to FIG. 4D. Subsequently, the AC signal of the second electrode 1123 is stopped, which causes the trapped particle 130 and 131 to move deeper into the channel 11 due to the electro-osmotic flow generated by the actuator 151 and 152 and due to the repelling AC signal of the select electrode 1124. While the particle 130 or 131 passes the reading electrode 1121 as it moves into the channel 11, the particle 130 and 131 type can be detected by the reading electrode 1121 to record any write errors. Finally, the row of channels 11 that was written is closed by the electrostatic barrier electrode 1120.

Example 2: First and Second Particles

The first particles 130 and second particles 131 of Example 1 may, for instance, include spherical, homogeneous particles with different dielectric permittivities. For a homogeneous particle, radius r in an electric field E, the dielectrophoresis force can be expressed as:

$$\langle F_{DEP} \rangle = 2\pi r^3 \varepsilon_m^* \mathrm{Re}\left\{ \frac{\varepsilon_{\mathit{eff}}^* - \varepsilon_m^*}{\varepsilon_{\mathit{eff}}^* + 2\varepsilon_m^*} \right\} \nabla |\vec{E}_{rms}|^2$$

wherein $$\varepsilon_{\mathit{eff}}^* = \varepsilon_s^* \frac{(r_2/r_1)^3 + 2\frac{\varepsilon_p^* - \varepsilon_s^*}{\varepsilon_p^* + 2\varepsilon_s^*}}{(r_2/r_1)^3 - \frac{\varepsilon_p^* - \varepsilon_s^*}{\varepsilon_p^* + 2\varepsilon_s^*}}$$

wherein $\varepsilon_p^*$ and $\varepsilon_s^*$ are the complex permittivities of the particle core and shell, respectively, and $r_1$ and $r_2$ are the radii of the core and shell, respectively. (See Kim, D. et al. Analytical Chemistry 91 (2018) pages 277-295.) The frequency dependent relationship between the different complex permittivities and the sign and magnitude of the dielectrophoresis force is no longer straightforward, which allows for engineering of the dielectrophoretic force exerted on the first particles 130 and on the second particles 131 by varying the core and shell radii and materials.

An example of possible characteristics of the first and second particles are summarized in Table 1. These characteristics serve as an example, but the disclosed technology is not limited to these characteristics.

TABLE 1

|  | First particles | Second particles |
|---|---|---|
| $r_1/r_2$ (nm) | 4.5/5 | 2.5/5 |
| $\varepsilon_p$ ($\varepsilon_0$) | 100 | 100 |
| $\varepsilon_s$ ($\varepsilon_0$) | 30 | 100 |
| $\sigma_p$ (S/m) | $5.96 \times 10^7$ | $5.96 \times 10^7$ |
| $\sigma_s$ (S/m) | $6.7 \times 10^{-14}$ | $2 \times 10^{-3}$ |

Figure 6A:
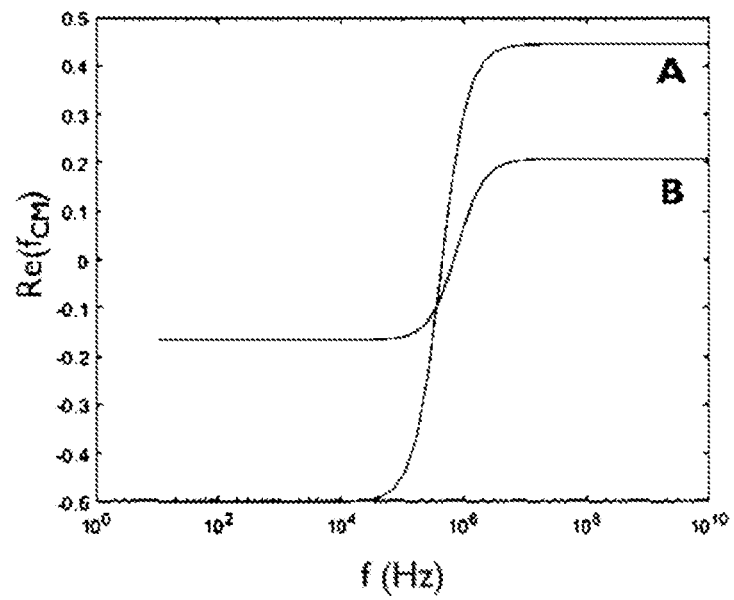
FIG. 6A and FIG. 6B are plots of a calculated frequency dependence of a Clausius-Mossotti factor for two core-shell particles according to embodiments of the disclosed technology.

Reference is made to FIG. 6A, which is a plot of the Clausius-Mossotti factor $(\varepsilon^*_{\mathit{eff}} - \varepsilon^*_m)/(\varepsilon^*_{\mathit{eff}} + 2\varepsilon^*_m)$ for the core-shell particles with the characteristics summarized in Table 1, as a function of frequency. Below a frequency of 10 GHz, typically three frequency regimes can be defined, since each particle has one cross-over frequency at which the Clausius-Mossotti factor changes sign. To create a fourth regime, a superposition of frequencies is required: a low frequency signal that is modulated with a higher frequency signal. That is, the four frequency regimes may include: 1) at intermediate frequencies, the Clausius-Mossotti factor of the first particles is positive, while that of the second particles is negative, so the first particles are attracted, while the second particles are repelled. 2) At high frequencies, both particles have a positive Clausius-Mossotti factor, so both are attracted. 3) At low frequencies, the Clausius-Mossotti factor is negative for both particles, so both are repelled. 4) When a low frequency signal is modulated with a high frequency signal, a sum of the responses at low and high frequency is obtained: since the positive high frequency response for the first particles is smaller than the negative frequency response at low frequency, the resulting response is negative. For the second particles, the high frequency response is larger than the negative, so the result is positive. Therefore, the first particles are repelled while the second particles are attracted.

A second example of possible characteristics of the first and second particles are summarized in Table 2. These characteristics serve as an example, but the disclosed technology is not limited to these characteristics.

TABLE 2

|  | First particles | Second particles |
|---|---|---|
| $r_1/r_2$ (nm) | 4.5/5 | 0.5/5 |
| $\varepsilon_p$ ($\varepsilon_0$) | 100 | 100 |
| $\varepsilon_s$ ($\varepsilon_0$) | 30 | 30 |
| $\sigma_p$ (S/m) | $5.96 \times 10^7$ | $5.96 \times 10^7$ |
| $\sigma_s$ (S/m) | $6.7 \times 10^{-14}$ | $2 \times 10^{-2}$ |

Figure 6B:
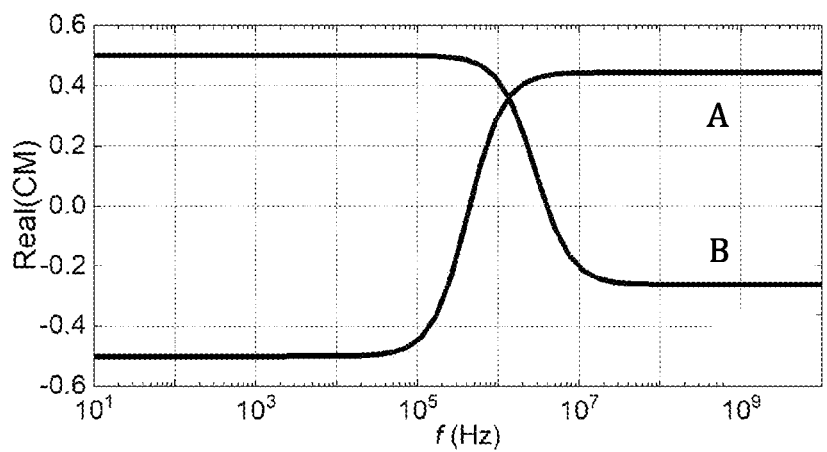

Reference is made to FIG. 6B, which is a plot of the Clausius-Mossotti factor $(\varepsilon^*_{\mathit{eff}} - \varepsilon^*_m)(\varepsilon^*_{\mathit{eff}} + 2\varepsilon^*_m)$ for the core-shell particles with the characteristics summarized in Table 2, as a function of frequency. In this example, three frequency regimes can be defined. In a first regime, below about $3 \times 10^5$ Hz, the first particles are repelled and the second particles are attracted. In a second regime, from about $3 \times 10^5$ Hz to about $3 \times 10^6$ Hz, both the first particles and the second particles are attracted. In a third regime, from about $3 \times 10^6$ Hz, the first particles are attracted and the second particles are repelled.

Example 3: Memory Device Including a Space: with Reservoir

Figure 7:
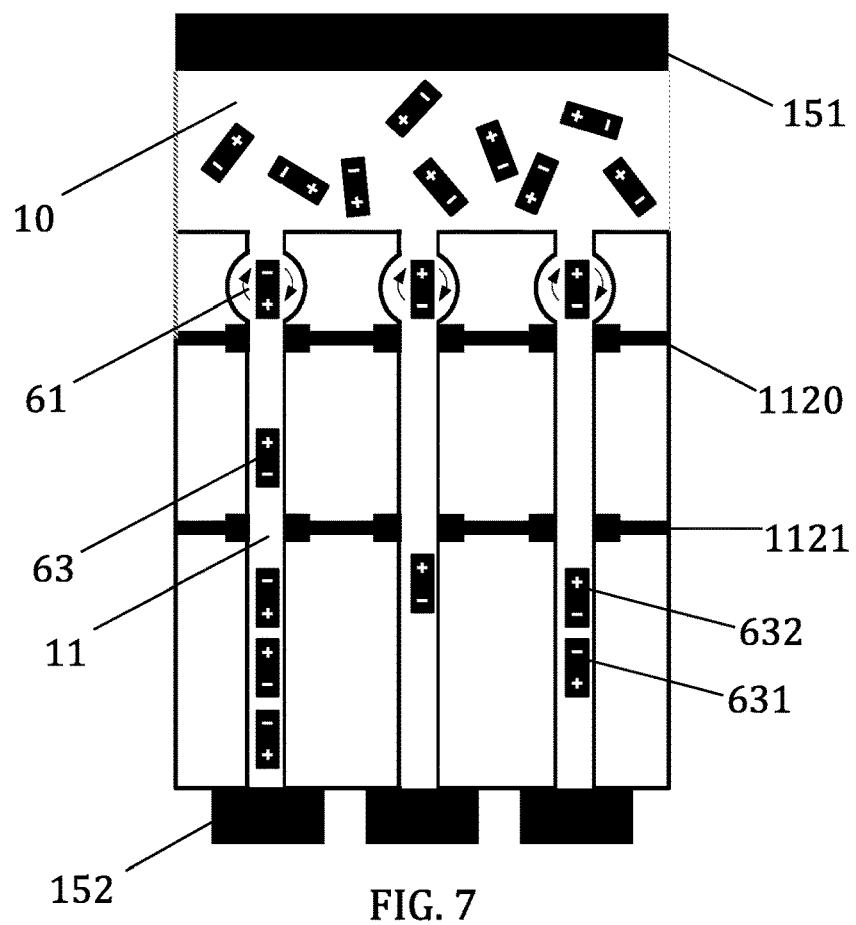
FIG. 7 is a vertical cross-section of a memory device including elongated dipolar particles and a reservoir according to embodiments of the disclosed technology.

Reference is made to FIG. 7. A memory device includes channels 11 fluidically coupled to a reservoir 10, wherein the channels 11 and the reservoir 10 include a fluid including elongated dipolar particles 63. The particles 63 can be in a first state 631 or in a second state 632 in the channel 11. The channel 11 is adapted, for example, narrow so that the particles 63 cannot rotate. Furthermore, the channel is sufficiently narrow so that the particles 63 cannot pass each other in the channel 11. Hence, the channel 11 is adapted so that a sequence of the particles 63 in the channel 11 is preserved. The reservoir 10 is sufficiently large so that the particles 63 can rotate and move past each other.

The channel 11 includes, in a wall of the channel 11, a reading element 1121 for detecting the sequence of the particles 63 in the channel 11. Advantageously, the reading element 1121 is located approximately halfway of the channel 11, so that detecting of the particles 63 by the reading element 1121 does not necessarily result in loss of the sequence, for instance by the particles 11 moving from the channel 11 into the reservoir 10. An actuator includes a first electrode 151 at a second side of the reservoir 10 that is opposite to a first of the reservoir 10 where the reservoir 10 is fluidically coupled the channels 11. The actuator furthermore includes, at a second end of the channel 11, a second electrode element 152. This configuration advantageously allows the actuator to induce a movement of the particles 63 only in a single channel 11. The actuator may, for instance, be configured to induce the movement by electrophoresis.

In this example, the memory device further includes a space 61 fluidically coupled to the channel 11 and to the reservoir 10, and located between the channel 11 and the reservoir 10. The space 61 is large enough for enabling inverting the orientation of the dipolar particle 63. At the same time, the space 61 is small enough so that no two particles 63 may be present in the space 61 at the same time. A writing element in a wall of the space 61 is adapted to invert the orientation of the dipolar particle 63 in the space 61. Furthermore, an electrostatic barrier 1120 may be opened to either allow or prevent movement of the dipolar particle 63 between the space 61 and the channel 11.

Example 4: Memory Device Including a Space: without Reservoir

Figure 8:
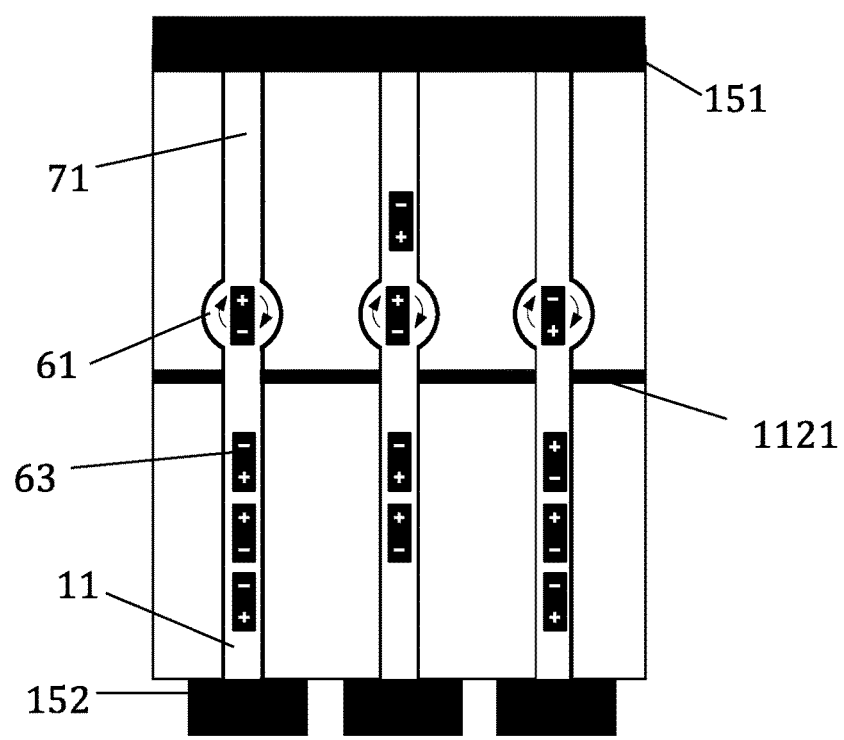
FIG. 8 is a vertical cross-section of a memory device including elongated dipolar particles according to embodiments of the disclosed technology.

Reference is made to FIG. 8, showing an example of a memory device not including a reservoir. A channel 11 is connected, that is fluidically coupled, to a space 61 for inverting an orientation of an elongated dipolar particle 63, which is, in turn, connected, that is fluidically coupled, to a further channel 71. The channel 11, the space 61 and the further channel 71 include the fluid including elongated dipolar particles 63. A longitudinal axis of the channel 11 and a longitudinal axis of the further channel 71 are aligned along a shared axis. The channel 11 includes a reading element 1121 in a wall of the channel 11. An actuator including a first electrode 151 at an end of the further channel 71 that is not an end coupled to the space 61, and a second electrode 152 at an end of channel not coupled to the space 61, may induce, in each channel 11 separately, a movement of the particles 63 in the channel 11, in the space 61, and in the further channel 71. Advantageously, the channels 11 and further channels 71 are prefilled, so that it is not required to move particles, for example, from a reservoir into the channel 11, which may be a time-consuming process. Instead, the particles 63 can, in this example, only move along a single axis, which may advantageously result in a faster and more predictable timing for arranging the particles 63 in a sequence in the channel 11. Furthermore, detecting of the sequence of the particles 63 by the reading element 1121 does not result in loss of the sequence of the particles 63. Advantageously, the reading element 1121 is located at a first end of the channel 11, close to the space 61. Thereby, the reading element 1121 can check whether the particle 63 leaving the space 61 is oriented in the required direction. Furthermore, thereby, the reading element 61 may detect whether a particle 63 in the channel 11 is oriented in the right direction, and if not, the actuator may move the particle 63 into the space 61: subsequently, the writing element may invert the orientation of the particle 63.

Example 5: Method for Making a Memory Device Including Horizontal Channels

Figure 9:
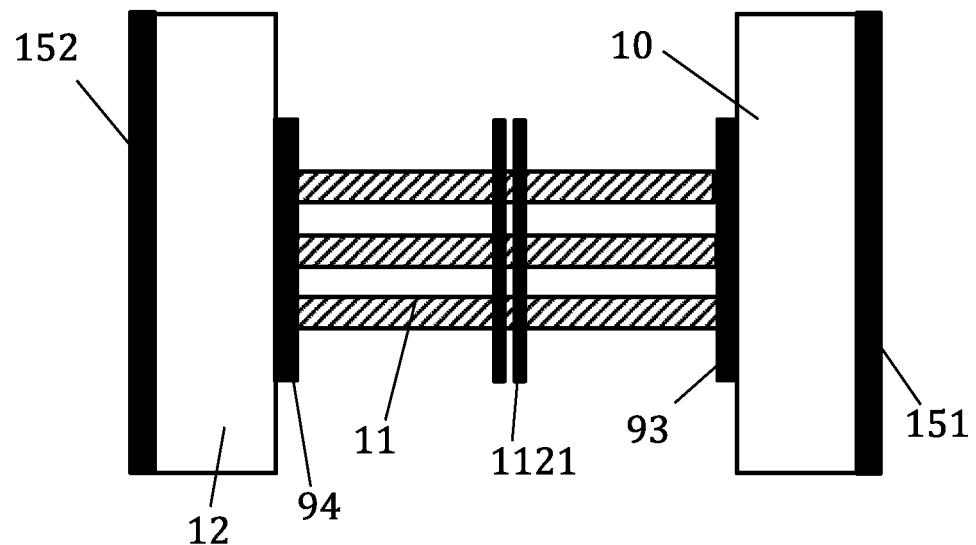
FIG. 9 is a top view of a memory device includes channels aligned parallel to a top surface of a substrate according to embodiments of the disclosed technology.
Figure 10:
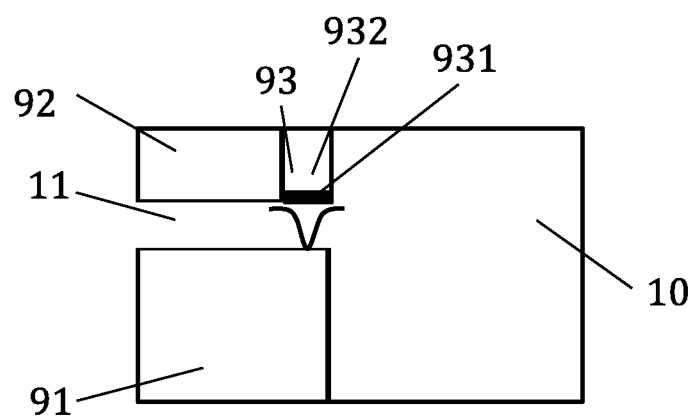
FIG. 10 is a horizontal cross-section of a memory device including channels aligned parallel to a top surface of a substrate according to embodiments of the disclosed technology.

Reference is made to FIG. 9, which shows a top view of a memory device, and to FIG. 10, which shows a side view of the memory device. According to a first embodiment of the method of the disclosed technology, channels 11 may be provided by etching the channels in a bulk material 91, wherein a longitudinal axis of the channels 11 is parallel to a top surface of the bulk material 91. The bulk material 91 may, for instance, include Si, although other materials may be used. The material of the bulk material is, however, not very relevant for the disclosed technology. For this, firstly, a hard-mask pattern may be provided, for instance by self-aligned double patterning or self-aligned quadruple patterning. Secondly, the channels 11 may be etched in the bulk material 91. Next, the channels 11 may be temporarily filled with a filler material, such as an oxide. Next, a step of chemical mechanical polishing may be performed for smoothening of the top surface of the bulk material 91. Subsequently, a top cover layer 92 may be deposited on top of the top surface of the bulk material 91 and on top of the filler material filling the channels 11.

Next, a first end of the channels 11 is exposed by removing part of the top cover layer 92 on top of the first end 911 of the channels 11, for example, by an etching technique. Subsequently, a stack 93 is deposited on top of the first end of the channels 911, on top of the filler material filling the channels. The stack 93 may, for instance, include a dielectric material 931 and a metal 932 on top of the dielectric material 931.

Furthermore, a second end of the channels is exposed by removing part of the top cover layer on top of the second end of the channels, for example, by using an etching technique. Subsequently, dielectric material may be deposited on top of second end of the channels, on top of the filler material filling the channels.

Furthermore, halfway the channels, the channels are exposed by removing part of the top cover layer on top of the channels halfway of the channels, for example, by using an etching technique. Subsequently, a pair of electrodes, for use as reading element 1121, that is, by measuring a capacitance between the electrodes of the pair of electrodes, may be deposited on top of the channels halfway of the channels.

In embodiments, the dielectric material deposited at the first end 931 and at the second end 94 may be selected such that a zeta potential of the dielectric differs from a zeta potential of material of walls of the channel, and wherein the zeta potential, in absence of a field generated by the electrode, of the dielectric material does not allow the nanoparticles to pass, that is, an electrostatic barrier is formed. For instance, the zeta potential of the dielectric material is selected such that a charge on a surface of the dielectric has the same sign as a charge on a surface of nanoparticles. At the same time, liquid and (small) ions may pass. An electric potential may be applied to the electrode material 932 on top of the dielectric material 931 at the first end of the channel, with respect to a counter or reference electrode in the liquid, to reduce or fully remove the electrostatic barrier, thereby allow particles to pass. Hence, the stack of dielectric material and electrode may function as electrostatic barrier.

Next, a reservoir and a further reservoir may be etched. At a second side of the reservoir 10, a first electrode 151 of an actuator may be deposited. At a second side of the further reservoir 12, a second electrode 151 of an actuator may be deposited. The channels may be opened by removing the filling material, for example, by a wet or dry treatment. The reservoir 10, the further reservoir 12, and the channels 11 may subsequently be filled with a fluid including the particles. Finally, the reservoir 10 and further reservoir 12 may be closed by a further top cover layer.

Example 6: Making a Memory Device Including Vertical Channels

Figure 11:
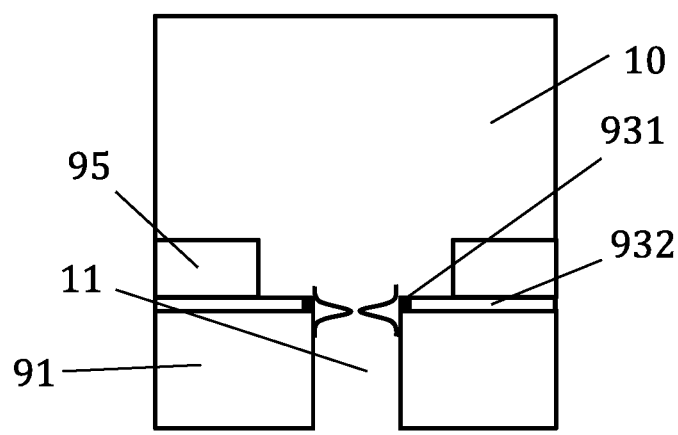
FIG. 11 is a vertical cross-section of a memory device including channels aligned perpendicular to a top surface of a substrate according to embodiments of the disclosed technology.

Reference is made to FIG. 11. Instead of making a memory device including horizontal channels, it is also possible to make a memory device including vertical channels. A bulk material 91 is obtained. Next, a conductive material 932, such as doped silicon or a metal, is deposited on top of the bulk material 91. Subsequently, a top cover layer 95, that is electrically nonconductive, may be deposited to cover at least the conductive material 932. Next, the top cover layer 95, the conductive material 932, and the bulk material 91 may be patterned to form the channels 11, wherein a longitudinal axis of the channels 11 is perpendicular to a top surface of the top cover layer 95.

Next, an oxide layer 931 may be grown on an exposed surface of the conductive material 932, wherein the exposed surface is exposed to the channel 11. The oxide layer 931 may act as an electrostatic barrier layer when no potential is applied to the conductive material 932, so that no particles may pass. Application of a potential to the conductive material 932 may result in removal of the electrostatic barrier layer, so that particles may pass, and, for example, move between the channel 11 and reservoir.

Example 7: Method for Making a Memory Device

Figure 12:
FIGS. 12-25 are schematic representations of vertical cross-sections through subsequent steps in the fabrication of a memory device according to an embodiment of the disclosed technology.

In the following example, a method according to embodiments of the disclosed technology is provided for making a memory device according to embodiments of the disclosed technology. Reference is made to FIG. 12, where a substrate 81 is shown. The substrate 81 may, for instance, include a silicon substrate, for example, a silicon wafer, but is not limited thereto.

Figure 13:
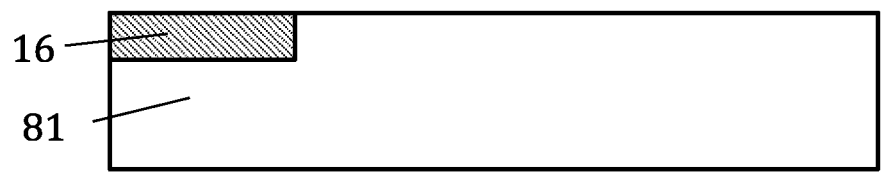

Reference is made to FIG. 13. A circuit 16, for example, a CMOS circuit, is obtained in the substrate 81, for instance using a Front End Of Line (FEOL) technique as is well-known to the skilled person.

Figure 14:
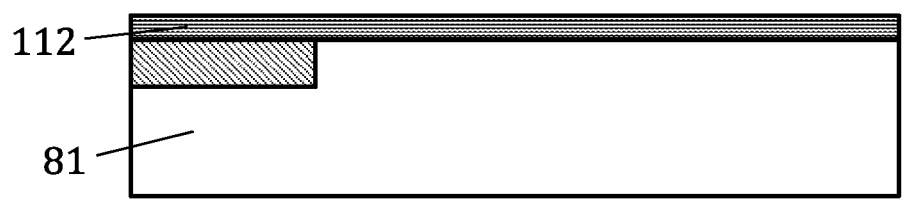

Reference is made to FIG. 14. In this example, an addressing element 112 including a reading element and a writing element is deposited on top of the substrate 81 and in electrical contact with the circuit 16.

Figure 15:
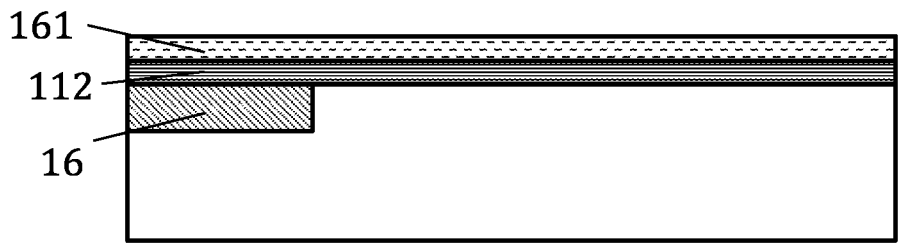

Reference is made to FIG. 15. On top of the addressing element 112, a further circuit 161 is deposited, for instance using Back End Of Line (BEOL) techniques well-known to the skilled person. In this example, the further circuit 161 provides control to address each of the channels of the memory device formed according to the method of this example.

Figure 16:
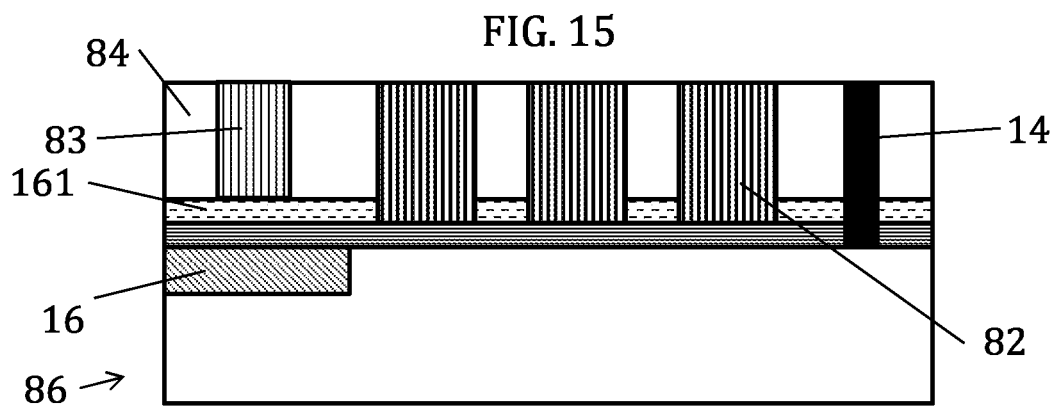

Reference is made to FIG. 16. A material 84, for example, a dielectric material, may be deposited on the further circuit 161. A deep via 83 is etched in the material 84 that may be used to provide electrical contact between the circuit 16 and further circuit 161, and a counter electrode that is obtained in a later step. The deep via 83 may for instance be filled with conductive material. Furthermore, an array of channels 82 is etched in the material 84. In this example, three arrays of channels 82 are etched. In addition, a recycling column 14 is etched. The channels of the arrays of channels 82 and the recycling column 14 are filled with a sacrificial material such as $Si_3N_4$. Thereby, a first structure 86 is obtained.

Figure 17:
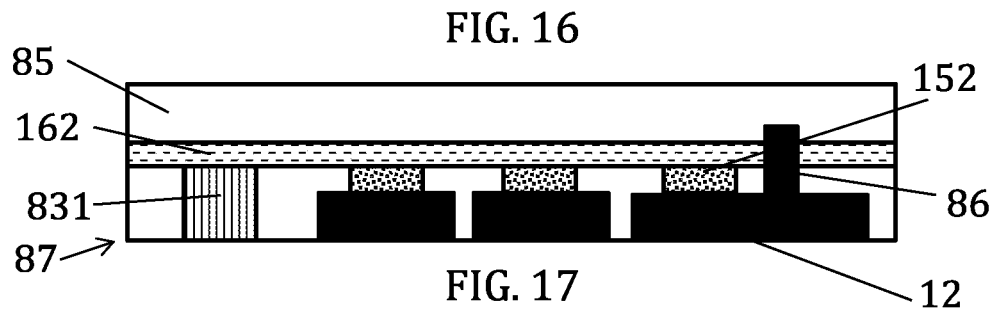

Reference is made to FIG. 17. Next, a second structure 87, different from the first structure, is obtained. The second structure 87 includes a second substrate 85, for example, a wafer, an interconnect 162, a further deep via 831 that may be filled with conductive material, counter electrodes 152, and a cavity including a further reservoir 12 and an inlet 86. The cavity is in this example filled with sacrificial material, for example, $Si_3N_4$. The second structure 87 may be obtained using similar techniques as used for the first structure 86.

Figure 18:
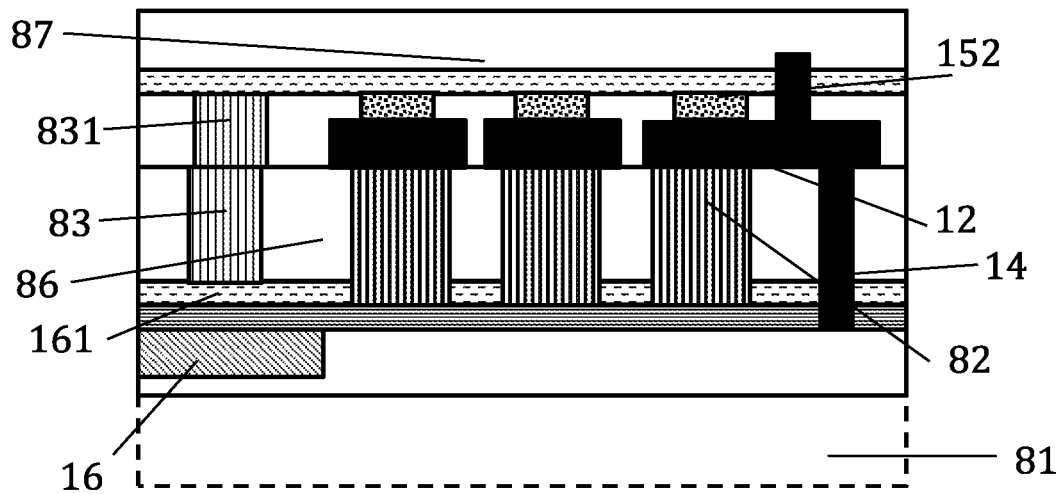

Reference is made to FIG. 18. The first structure 86 is contacted with the second structure 87. For instance, wafer-to-wafer bonding, well-known to the skilled person, may be used to bind the first structure 86 to the second structure 87. Herein, the deep via 83 and the further deep via 831 contact each other, thereby enabling electrical contact between the circuit 16 and the further circuit 161, and the counter electrodes 152. Furthermore, the first structure 86 is contacted with the second structure 87 so that the further reservoir 12, the array of channels 82, and the recycling column 14 are fluidically coupled. After contacting and binding of the first structure 86 and the second structure 87, part of the substrate 81 is in this example removed, for example, using etching. The removed part is indicated by the dashed lines.

Figure 19:
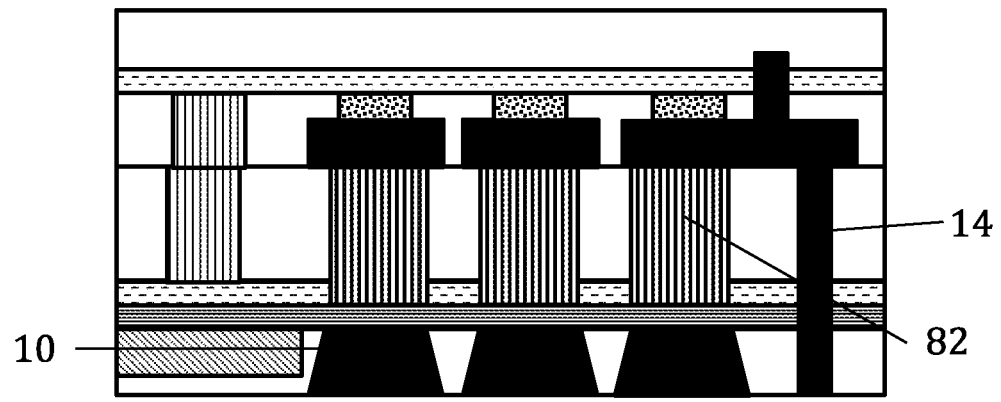

Reference is made to FIG. 19. For each of the arrays of channels 82, a reservoir 10 is obtained, for instance using etching. Each reservoir 10 is fluidically coupled to the arrays of channels 82. The reservoirs 10 are filled with a sacrificial material, for example, $Si_3N_4$. Furthermore, the recycling column 14 is elongated, for example, using etching, and filled with a sacrificial material.

Figure 20:
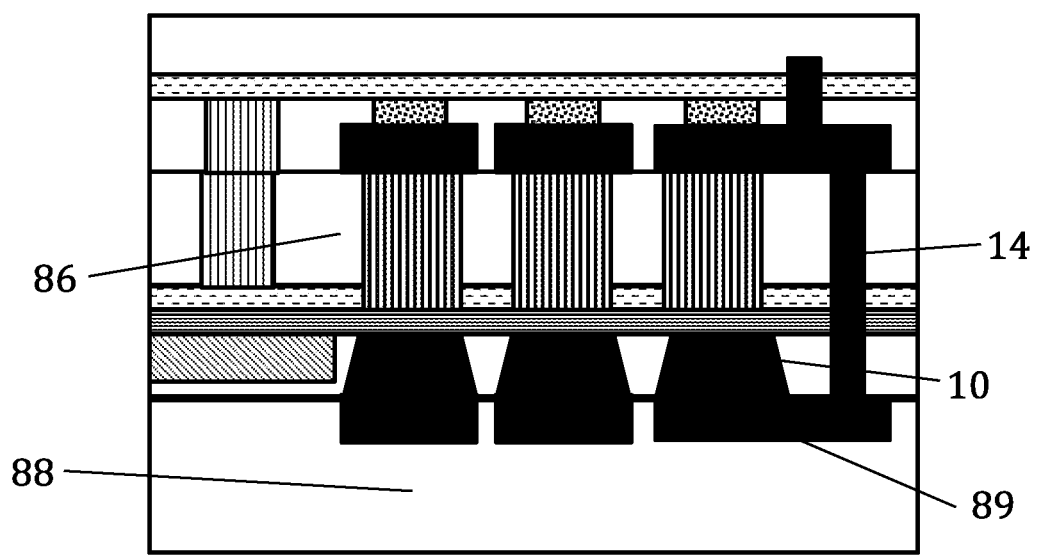

Reference is made to FIG. 20. A third structure 88 is provided including second cavities 89. The third structure 88 is contacted with the first structure 86 so that the second cavities 89 are fluidically connected to the recycling column 14 and the reservoirs 10.

Figure 21:
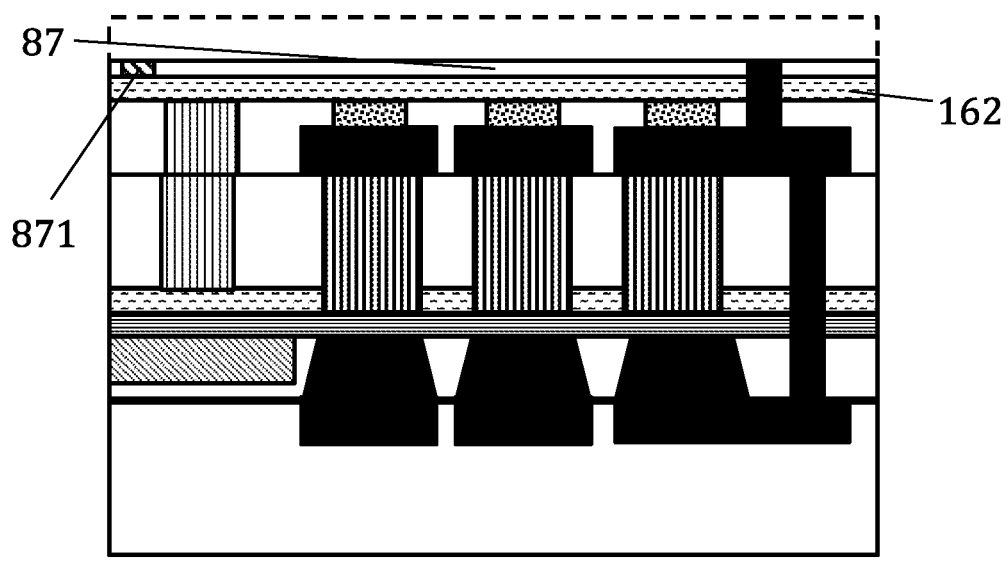

Reference is made to FIG. 21. Part of the second structure 87 is removed, for example, by etching. The removed part is indicated by the dashed lines. Subsequently, in the second structure 87 a bonding pad 871 is provided, electrically contacting the interconnect 162.

Figure 22:
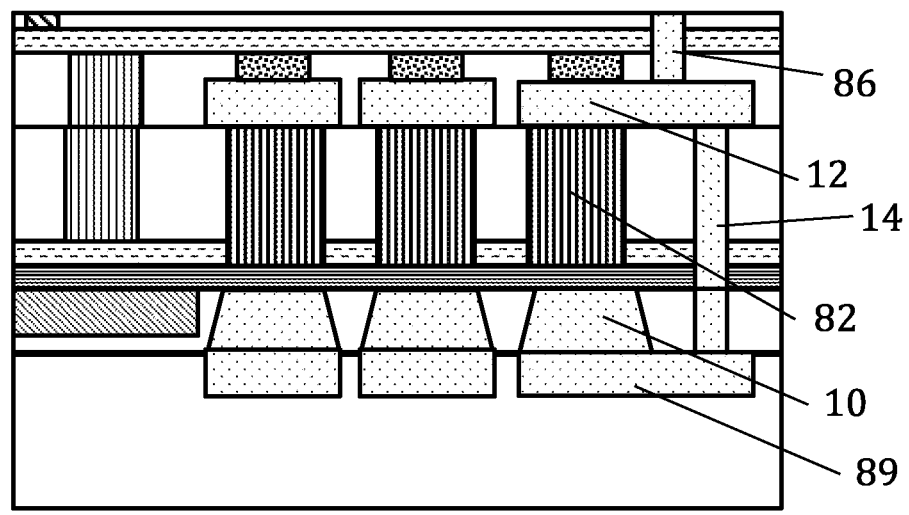

Reference is made to FIG. 22. The sacrificial material may be removed from the cavities, the recycling column, the reservoirs, and the channels, for instance using HF. After removal of the sacrificial material, the cavity including the further reservoir 12 and inlet 86, the second cavity 89, the recycling column 14, the reservoirs 10, and the channels of the arrays of channels 82 are empty.

Figure 23:
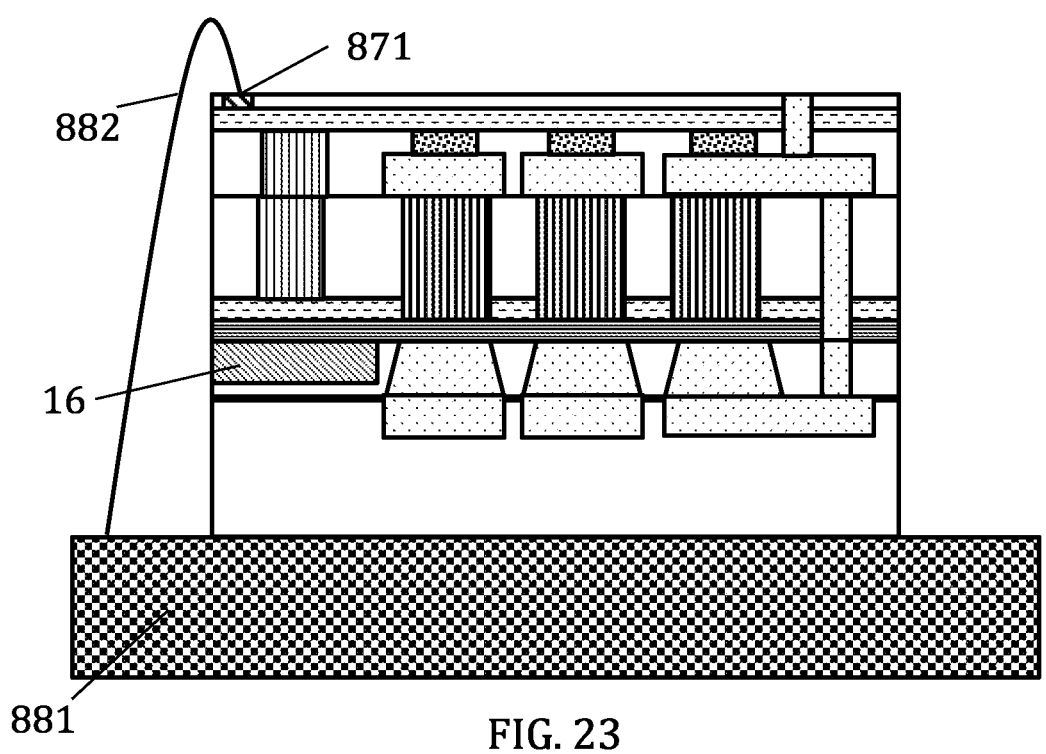

Reference is made to FIG. 23. A fourth structure 881, that may be a packaging substrate, may be provided. The bonding pad 871 is connected with a conductive wire 882. The conductive wire 882 contacts the fourth substrate 881. The conductive wire 882 may thereby for instance be used to provide power to the circuit 16.

Figure 24:
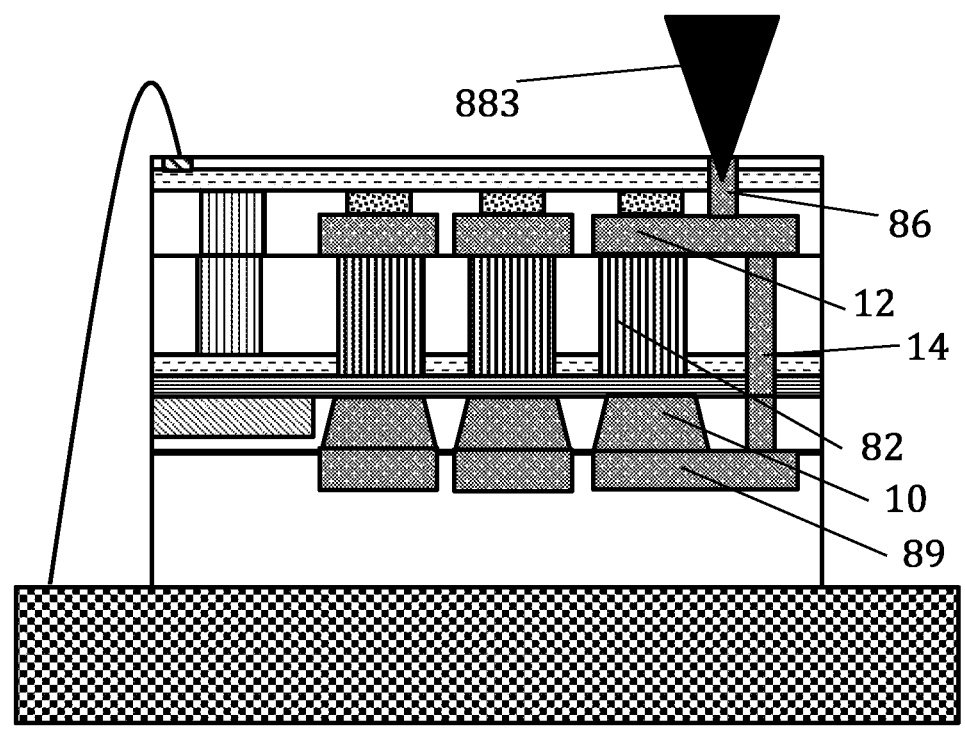
Figure 25:
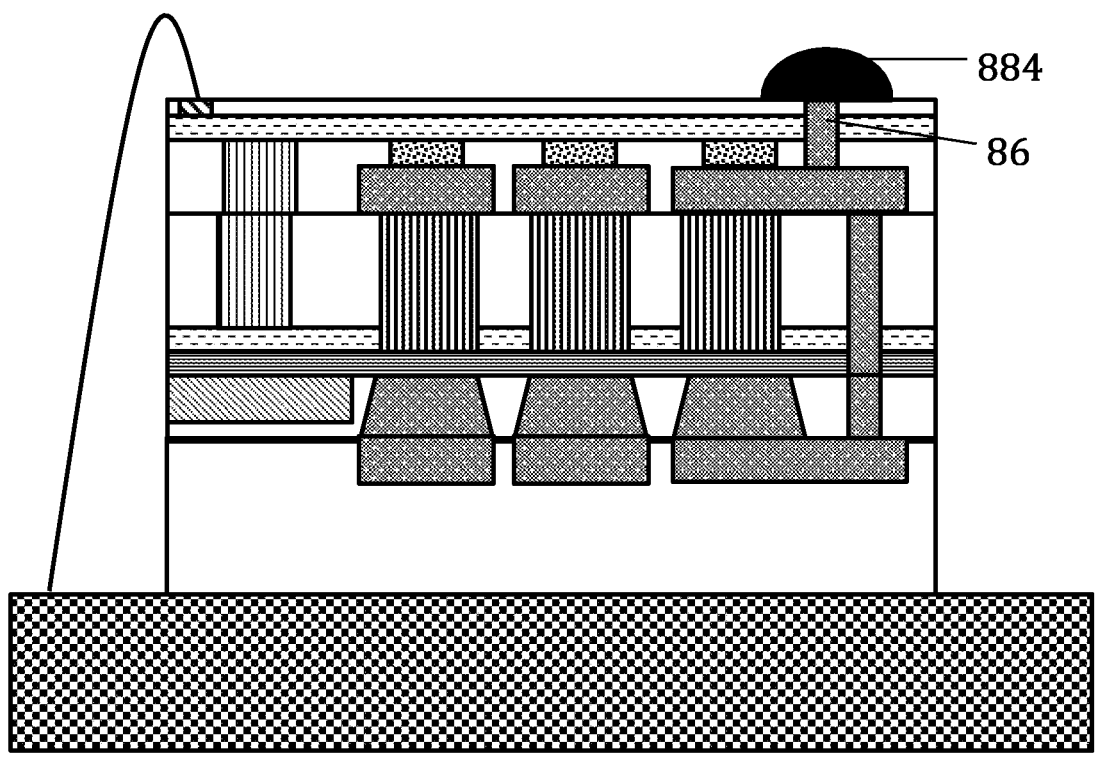

Reference is made to FIG. 24. Via the inlet 86, the further reservoir 12, the second cavity 89, the recycling column 14, the reservoirs 10, and the channels of the arrays of channels 82 may be filled with a fluid including particles. For the filling, for instance, a syringe 883 may be used. Reference is made to FIG. 25. After the filling with the fluid, the inlet 86 may be covered with a sealing cap 884. The sealing cap 884 may, for instance, include a raisin. Thereby, the memory device may be hermetically sealed, so that the fluid may not leave the memory device. Furthermore, the fluid may not be contaminated by contaminants from outside of the memory device.

It is to be understood that although certain embodiments, specific constructions and configurations, as well as materials, have been discussed herein for devices according to the disclosed technology, various changes or modifications in form and detail may be made without departing from the scope of this disclosed technology. For example, any formulas given above are merely representative of procedures that may be used. Functionality may be added or deleted from the block diagrams and operations may be interchanged among functional blocks. Steps may be added or deleted to methods described within the scope of the disclosed technology.

What is claimed is:

1. A memory device comprising:
    at least one channel;
    a fluid including particles, wherein the at least one channel comprises a least some of the fluid;
    an actuator for inducing a movement of the particles in the at least one channel;
    a writing element configured to arrange the particles in a sequence, thereby yielding a sequence of particles in the at least one channel, wherein either:
        the particles comprise first particles and second particles, and wherein arranging of the particles comprises arranging the first particles and the second particles in a particular order, or
        the particles can be in a first state or a second state in the at least one channel, and wherein arranging of the particles comprises arranging the particles in the first state and the second state in the particular order,
    and wherein the at least one channel is configured to preserve the sequence of the particles; and
    a reading element for detecting the sequence of the particles in the at least one channel.

2. The memory device according to claim 1, further comprising a reservoir fluidically coupled to the at least one channel, wherein the reservoir comprises some of the fluid, and wherein the actuator is configured to induce a movement of the particles between the reservoir and the at least one channel.

3. The memory device according to claim 1, wherein the at least one channel is a nanochannel.

4. The memory device according to claim 2, wherein the reading element is configured to either:
    detect the particles moving from the reservoir into the at least one channel, or
    detect the particles moving between a first part of the at least one channel and a second part of the at least one channel.

5. The memory device according to claim 1, wherein the reading element comprises a capacitor or a field effect transistor, or is configured to detect a magnetic field.

6. The memory device according to claim 1, wherein the actuator is configured to induce the movement by electrophoresis, dielectrophoresis, a fluid-dragging force, a magnetic force, or an electrical force.

7. The memory device according to claim 1, wherein the particles comprise the first particles and the second particles, and wherein the writing element is configured to determine which particles of the first particles and the second particles move into the at least one channel.

8. The memory device according to claim 7, wherein the writing element is an electronically controlled gate.

9. The memory device according to claim 2, wherein the actuator is configured to move a random particle from the reservoir to an entrance to the at least one channel, and wherein the writing element is configured to determine which particles of the first particles and the second particles is at the entrance.

10. The memory device according to claim 7, wherein the first particle and the second particle differ in size.

11. The memory device according to claim 7, wherein the first particles and the second particles have different dielectric properties, and wherein the reading element comprises a capacitor.

12. The memory device according to claim 11, wherein the first particles and the second particles have a core and a shell, wherein the core and the shell have a dielectric constant different from the dielectric constant of the fluid, wherein a material of the shell of the particles is charged in the fluid, wherein a zeta potential of the material of the shell is the same for the first particles and the second particles, and wherein a dielectric constant of the material of the core of the first particles differs from a dielectric constant of the core of the second particles.

13. The memory device according to claim 1, wherein the particles comprise dipolar particles, and wherein the memory device further comprises a space, fluidly coupled to the at least one channel and large enough for enabling inverting an orientation of a dipolar particle, while remaining small enough to preserve the sequence of the particles, wherein the writing element is configured for inverting the orientation of the dipolar particle present in the space.

14. The memory device according to claim 13, wherein the space is fluidically coupled to a further channel comprising some of the fluid.

15. A method for making the memory device of claim 1, comprising:
    obtaining the at least one channel;
    filling the at least one channel with the fluid comprising the particles;
    providing the memory device with the actuator configured to induce a movement of the particles in the channel;
    providing the memory device with the writing element configured to arrange the particles in a sequence, thereby yielding a sequence of particles in the channel; and
    providing the memory device with the reading element configured to detect the sequence of the particles in the channel,
    wherein the channel is adapted to preserve the sequence of the particles.

* * * * *

UNITED STATES PATENT AND TRADEMARK OFFICE
CERTIFICATE OF CORRECTION

PATENT NO. : 11,776,564 B2
APPLICATION NO. : 17/645663
DATED : October 3, 2023
INVENTOR(S) : Maarten Rosmeulen et al.

It is certified that error appears in the above-identified patent and that said Letters Patent is hereby corrected as shown below:

In the Specification

Column 24, Line 11, delete "$(\varepsilon^*_{\mathit{eff}} - \varepsilon^*_m / (\varepsilon^*_{\mathit{eff}} + 2\varepsilon^*_m)$" and insert -- $(\varepsilon^*_{\mathrm{eff}} - \varepsilon^*_m)/(\varepsilon^*_{\mathrm{eff}} + 2\varepsilon^*_m)$ --.

Column 24, Line 51, delete "$(\varepsilon^*_{\mathit{eff}} - \varepsilon^*_m (\varepsilon^*_{\mathit{eff}} + 2\varepsilon^*_m)$" and insert -- $(\varepsilon^*_{\mathrm{eff}} - \varepsilon^*_m)/(\varepsilon^*_{\mathrm{eff}} + 2\varepsilon^*_m)$ --.

Signed and Sealed this
Twenty-sixth Day of December, 2023

*Katherine Kelly Vidal*

Katherine Kelly Vidal
*Director of the United States Patent and Trademark Office*